(12) United States Patent
Chen et al.

(10) Patent No.: US 7,463,404 B2
(45) Date of Patent: Dec. 9, 2008

(54) METHOD OF USING A PREFERENTIALLY DEPOSITED LUBRICANT TO PREVENT ANTI-STICTION IN MICROMECHANICAL SYSTEMS

(75) Inventors: Dongmin Chen, Saratoga, CA (US); Fulin Xiong, San Jose, CA (US)

(73) Assignee: Miradia, Inc., Sunnyvale, CA (US)

( * ) Notice: Subject to any disclaimer, the term of this patent is extended or adjusted under 35 U.S.C. 154(b) by 210 days.

(21) Appl. No.: 11/556,154

(22) Filed: Nov. 2, 2006

(65) Prior Publication Data

US 2007/0115532 A1 May 24, 2007

Related U.S. Application Data

(60) Provisional application No. 60/733,730, filed on Nov. 3, 2005.

(51) Int. Cl.
  *G02B 26/00* (2006.01)
(52) U.S. Cl. .................. 359/290; 359/291; 359/292
(58) Field of Classification Search ............ 359/290, 359/291, 292, 293, 295, 298, 223, 224, 900; 438/115, 116; 257/682, 721
  See application file for complete search history.

(56) References Cited

U.S. PATENT DOCUMENTS

| | | | |
|---|---|---|---|
| 5,331,454 | A | 7/1994 | Hornbeck |
| 5,412,186 | A | 5/1995 | Gale |
| 5,447,600 | A | 9/1995 | Webb |
| 5,482,564 | A | 1/1996 | Douglas et al. |
| 5,512,374 | A | 4/1996 | Wallace et al. |
| 5,523,878 | A | 6/1996 | Wallace et al. |
| 5,576,878 | A | 11/1996 | Henck |
| 5,602,671 | A | 2/1997 | Hornbeck |
| 5,610,438 | A | 3/1997 | Wallace et al. |
| 5,694,740 | A | 12/1997 | Martin et al. |
| 5,771,116 | A | 6/1998 | Miller et al. |
| 5,936,758 | A | 8/1999 | Fisher et al. |
| 5,939,785 | A | 8/1999 | Klonis et al. |

(Continued)

OTHER PUBLICATIONS

Fadeev, et al. "Self-Assembled Monolayers of Organosilicon Hydrides Supported on Titanium, zirconium, and Hafnium Dioxides" Langmuir 2002 18 pp. 7521-7529.

(Continued)

*Primary Examiner*—Hung X. Dang
*Assistant Examiner*—Tuyen Q Tra
(74) *Attorney, Agent, or Firm*—Patterson & Sheridan, LLP

(57) ABSTRACT

Embodiments of the present invention generally relate to a device that has an improved usable lifetime due to the presence of a lubricant that reduces the likelihood of stiction occurring between the various moving parts in an electromechanical device. Embodiments of the present invention also generally include a device, and a method of forming a device, that has one or more surfaces or regions that have a volume of lubricant disposed thereon that acts as a ready supply of "fresh" lubricant to prevent stiction occurring between interacting components found within the device. In one aspect, components within the volume of lubricant form a gas or vapor phase that reduces the chances of stiction-related failure in the formed device. In one example, aspects of this invention may be especially useful for fabricating and using micromechanical devices, such as MEMS devices, NEMS devices, or other similar thermal or fluidic devices.

18 Claims, 17 Drawing Sheets

U.S. PATENT DOCUMENTS

| | | | |
|---|---|---|---|
| 5,961,732 | A | 10/1999 | Patrin et al. |
| 6,004,912 | A | 12/1999 | Gudeman |
| 6,024,801 | A | 2/2000 | Wallace et al. |
| 6,036,786 | A | 3/2000 | Becker et al. |
| 6,300,294 | B1 | 10/2001 | Robbins et al. |
| 6,365,229 | B1 | 4/2002 | Robbins |
| 6,475,570 | B2 | 11/2002 | Jacobs |
| 6,618,520 | B2 | 9/2003 | Tew |
| 6,674,140 | B2 | 1/2004 | Martin |
| 6,704,131 | B2 | 3/2004 | Liu |
| 6,709,948 | B2 | 3/2004 | Dewa et al. |
| 6,733,683 | B2 | 5/2004 | Dewa |
| 6,746,886 | B2 | 6/2004 | Duncan et al. |
| 6,764,875 | B2 | 7/2004 | Shook |
| 6,806,993 | B1 | 10/2004 | Adams et al. |
| 6,841,079 | B2 | 1/2005 | Dunbar et al. |
| 6,843,936 | B1 | 1/2005 | Jacobs |
| 6,891,657 | B2 | 5/2005 | Hewlett et al. |
| 6,921,680 | B2 | 7/2005 | Robbins |
| 6,930,367 | B2 | 8/2005 | Lutz et al. |
| 6,960,305 | B2 | 11/2005 | Doan et al. |
| 6,979,893 | B2 * | 12/2005 | Dunphy et al. ............... 257/682 |
| 7,042,623 | B1 * | 5/2006 | Huibers et al. ............... 359/291 |
| 7,068,417 | B2 | 6/2006 | Yang |
| 7,362,494 | B2 * | 4/2008 | Huibers et al. ............... 359/291 |
| 2003/0002019 | A1 | 1/2003 | Miller |
| 2004/0136044 | A1 | 7/2004 | Miller et al. |
| 2004/0145795 | A1 | 7/2004 | Pan et al. |
| 2004/0145822 | A1 | 7/2004 | Pan et al. |
| 2004/0159631 | A1 | 8/2004 | Pan et al. |
| 2004/0169190 | A1 | 9/2004 | Ueno et al. |
| 2004/0240033 | A1 | 12/2004 | Pan et al. |
| 2005/0104144 | A1 | 5/2005 | Yang et al. |
| 2005/0174628 | A1 | 8/2005 | Kelly et al. |
| 2006/0024919 | A1 | 2/2006 | Yang |
| 2006/0141745 | A1 | 6/2006 | Yang |

OTHER PUBLICATIONS

Helmy, et al. "Self-Assembled Monolayers Supported on TiO2: Comparison of $C_{18}H_{37}Six_3$(X=H, Cl, $OCH_3$), $C_{18}H_{37}Si(CH_3)2Cl$, and $C_{18}H_{37}P$". Langmuir 2002 18 pp. 8924-8928.

Pawsey, et al. "Self-Assembly of Carboxyalkylphosphonic Acids on Metal Oxide Powders" Langmuir 2002 18 pp. 5205-5212.

Love, et al. "Self-Assembled Monolayers of Thiolates on Metals as a Form of Nanlechnology" American Chemical Society—Chem Rev. 2005 105 pp. 1103-1169.

Abraham Ulman "An Introduction Ultrathin Organic Films from Langmuir-Blodgett to Self-Assembly" Academic Press 1991 pp. 236-305.

* cited by examiner

METHOD OF USING A PREFERENTIALLY DEPOSITED LUBRICANT TO PREVENT ANTI-STICTION IN MICROMECHANICAL SYSTEMS

CROSS-REFERENCE TO RELATED APPLICATIONS

This application claims benefit of U.S. Provisional Patent Application Ser. No. 60/733,730, filed Nov. 3, 2005, which is herein incorporated by reference.

BACKGROUND OF THE INVENTION

1. Field of the Invention

Embodiments of the present invention relate generally to micro-electro-mechanical and nano-electro-mechanical systems and more specifically to an anti-stiction and lubrication for such systems.

2. Description of the Related Art

As is well-known, atomic level and microscopic level forces between device components become far more critical as devices become smaller. Micromechanical devices, such as Micro-electro-mechanical systems (MEMS) and nano-electro-mechanical systems (NEMS), are an area where problems related to these types of forces are quite prevalent. In particular, "stiction" forces created between moving parts that come into contact with one another, either intentionally or accidentally, during operation are a common problem with micromechanical devices. Stiction-type failures occur when the interfacial attraction forces created between moving parts that come into contact with one another exceed restoring forces. As a result, the surfaces of these parts either permanently or temporarily adhere to each other, causing device failure or malfunction. Stiction forces are complex surface phenomena that generally include capillary forces, Van der Waal's forces and electrostatic attraction forces. As used herein, the term "contact" refers generally to any interaction between two surfaces and is not limited to the actual physical touching of the surfaces. Some examples of typical micromechanical devices are RF switches, optical modulators, microgears, accelerometers, worm gears, transducers, fluid nozzles, gyroscopes, and other similar devices or actuators.

The stiction issue is especially problematic in devices such as the RF switch, optical modulator, microgears, and other actuators. Various elements in these devices often interact with each other during operation at frequencies between a few hertz (Hz) and about a few gigahertz (GHz). Various analyses have shown that, without adding some form of lubrication to these types of devices to reduce stiction and wear between component surfaces, product lifetimes may range from only a few contacts to a few thousand contacts, which is generally well below a commercially viable lifetime. Consequently, one of the biggest challenges facing the MEMS and NEMS industries is the long-term reliability of contacting microstructures in the face of stiction.

Several techniques to address the stiction between two contacting surfaces have been discussed in the various publications. These techniques include texturing the surfaces (e.g., micro patterning or laser patterning) to reduce the overall adhesion force by reducing the effective contact area, and selecting specific materials from which the contacting surfaces are made to lower the surface energy, reduce charging, or contact potential difference between components.

Moreover, some prior references have suggested the insertion of a "lubricant" into the region around the interacting devices to reduce the chance of stiction-related failures. Such a lubricant often times is in a solid or liquid state, depending on the properties of the material, and the temperature and pressure or environment in which the lubricant is placed. In general, the terms a "solid" lubricant or a "liquid" lubricant is a lubricant that is in a solid or liquid state under ambient conditions, which is typically defined as room temperate and atmospheric pressure. Some prior art references describe a lubricant as being in a "vapor" state. These references use of the term vapor phase lubricant to generally describe a mixture of components that contain a carrier gas (e.g., nitrogen) and a vaporized second component that is a solid or liquid at temperatures and pressures near ambient conditions (e.g., STP). In most conventional applications the solid or liquid lubricant will remain in a solid or liquid state at temperatures much higher than room temperature and pressures much lower than atmospheric pressure conditions.

Another common approach to combat stiction between interacting components is to coat the various interacting components with a low-surface energy organic passivation layer, such as the self-assembled monolayer (SAM). The low-surface energy organic passivation layer coating results in a hydrophobic surface that is used to reduce or eliminate capillary forces, molecular bonding forces, and reduce electrostatic attraction forces in some cases. The material(s) used to form a SAM layers are typically liquids under ambient conditions. Self-assembled-monolayer coatings are commonly applied to MEMS type devices by immersion of the device in a liquid containing the components used to form the SAM molecules. In some cases low-surface energy organic passivation layer, such as a SAM coating, can be formed by exposing the surface of the device to a vapor containing a carrier gas that has SAM layer forming components entrained in it typically by bubbling the carrier gas through a vessel containing heated SAM layer forming components.

Another common approach to combat stiction between interacting components is to use a nebulization process that uses a liquid lubrication system that creates a lubricant "fog," or lubricant "mist," that lubricates the surfaces of the MEMS device by exposing the interacting surfaces to tiny droplets of the liquid lubricant that is suspended in a carrier gas. One such process is described in column 3, line 28 of U.S. Pat. No. 6,921,680, where it notes that "it is critical that the nebulizer system be maintained in a homogenous cloud of the lubricant around the device specimen." These types of systems require additional steps to keep the concentration of the liquid droplets within the lubricant "fog" homogeneous which can be complex and costly. The use of the lubricant "fog" will also require additional processing time to lubricate the devices to ensure that the "mist" reaches all parts of a device to form a suitable lubrication layer.

Examples of typical lubricants that are solid or liquid at ambient conditions and temperatures well above ambient temperature can be found in reference such as U.S.patent application Ser. No. 6,930,367. Such prior art lubricants include dichlordimethylsilane ("DDMS"), octadecyltrichlorsilane ("OTS"), perfluoroctyltrichlorsilane ("PFOTCS"), perfluorodecanoic acid ("PFDA"), perfluorodecyl-trichlorosilane ("FDTS"), perfluoro polyether ("PFPE") and/or fluoroalkylsilane ("FOTS") that are deposited on various interacting components by use of a vapor deposition process, such as atmospheric chemical vapor deposition (APCVD), low pressure chemical vapor deposition (LPCVD), plasma enhanced chemical vapor deposition (PECVD), or other similar deposition processes.

The technique of forming the low-surface energy organic passivation layer on the surface of MEMS/NEMS components is commonly referred to in the art as "vapor lubricant"

coating. One serious draw back to using low-surface energy organic passivation layer, such as SAM coatings, is that they typically are only one monolayer thick, although coatings that are a few monolayers have also been reported. Generally, these types of coatings have a very limited usable lifetime, since they are easily damaged or displaced due to impact or wear created by the interaction of the various moving components. This is inevitably happens in MEMS devices with contacting surfaces, such as light modulator and RF switches, that are subject to frequent contact in use and a large number of contacts during the product lifetime. Without some way to reliably restore or repair the damaged coatings, stiction inevitably returns, and device failure results.

One approach for repairing the damaged contacting area, coating being displaced or broken down (FIG. 1A) is to provide a getter 110 within the package 100 (that includes a base 102, a lid 104, and a seal 106) in which an array of MEMS devices 108 resides. FIG. 1B illustrates one conventional package 120 that contains a MEMS device 108 and a getter 110 which are positioned within the head space 124 of the package 120. The package 120 also contains a package substrate 128, window 126 and spacer ring 125. These two configurations are further described in U.S. patent application Ser. No. 6,843,936 and U.S. patent application Ser. No.6,979, 893, respectively. As previously indicated, these conventional devices employ some type of reversibly absorbing getter to store the lubricant molecules in the zeolite crystals or internal volume of a micro-tube. In these types of designs, a supply of lubricant is maintained in the getter 110 and an amount of lubricant needed to lubricate the MEMS device 108 is discharged during normal operation. However, adding the reversibly absorbing getter, or reservoirs, to retain the liquid lubricants increases package size and packaging complexity and adds steps to the fabrication process, thereby increasing piece-part cost as well as the overall manufacturing cost of MEMS or NEMS devices. Thus, forming a device that uses these techniques generally requires a number of labor-intensive and costly processing steps, such as mixing the getter material, applying the getter material to the device containing package, curing the getter material, conditioning or activating the getter material, and then sealing the MEMS device and the getter within the sealed package.

As the foregoing illustrates, what is needed in the art a more reliable and cost-effective approach to providing anti-stiction lubrication to MEMS and NEMS, particularly for the in-use replenishment of the lubricants, in addition to the initial coating of the MEMS/NEMS device with a lubricant.

SUMMARY OF THE INVENTION

One embodiment of the invention sets forth a method of operating a micromechanical device, comprising biasing one or more electrodes that are disposed within the processing region, wherein biasing the one or more electrodes causes a moveable component having a first contact surface to interact with a second contact surface, and wherein one or more normal operating conditions cause a lubricant molecule, which has a head group that is adapted to bond to a first surface disposed in the processing region, to migrate from the first surface to a space formed between the first and second contact surfaces during normal operation.

Embodiments of the invention may further provide a method of operating a micromechanical device comprising biasing one or more electrodes that are disposed within a processing region, wherein biasing the one or more electrodes causes a moveable component having a first contact surface to interact with a second contact surface, and delivering an amount of energy to a process surface that is contained within the processing region from an energy source that is in thermal communication with the process surface, wherein a plurality of lubricant molecules disposed on the process surface are adapted to detach from the process surface when exposed to the amount of energy and migrate to a position between the first contact surface and the second contact surface.

Embodiments of the invention may further provide a method of operating a micromechanical device comprising positioning a micromechanical device in a first position, wherein the micromechanical device comprises a first contact surface that is disposed in a processing region, an electrode coupled to a base, a mirror coupled to the base and having a conductive region, a reflective mirror surface and a second contact surface, wherein the second contact surface interacts with the first contact surface during device operation, a power supply that is in electrical communication with the conductive region and the electrode, and a plurality of lubricant molecules that each have a head group that is adapted to bond to a process surface, wherein the process surface is a portion of one or more walls that enclose the processing region, positioning a light source so that a portion of the optical radiation emitted by the light source is reflected by the mirror surface, and biasing the electrode relative to the conductive region to a potential that causes the mirror to move to a desired position and that causes the first contact surface to interact with the second contact surface, wherein during normal operation of the micromechanical device the plurality of lubricant molecules migrate from the process surface to a space formed between the first and second contact surfaces.

One advantage of the disclosed micromechanical device is that a large reservoir of a lubricating material is preferentially disposed on various surfaces within a device package so that an amount of "fresh" lubricating material can be delivered to areas where stiction may occur. In one aspect, the lubricating material is adapted to form one or more volatile component(s) that can diffuse at a substantially higher rate than conventional solid or liquid lubricants. A higher diffusion rate enables a lubricant to be self-replenishing, meaning that the lubricant can quickly move back into a contact region after being physically displaced from the region by the contacting surfaces of the electromechanical device during operation. Consequently, the lubricant more reliably prevents stiction-related device failures relative to conventional solid or liquid lubricants.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a device that has an improved usable lifetime due to the presence of a lubricant that reduces the likelihood of stiction occurring between the various moving parts of an electromechanical device. Embodiments of the present invention also generally include a device, and a method of forming the device, that has one or more surfaces or regions that have a volume of lubricant disposed thereon. This volume that acts as a ready supply of "fresh" lubricant to prevent stiction from occurring between interacting components of the device. The ready supply of "fresh" lubricants may also be used to replenish damaged lubricants (worn-off, broken down, etc) at the contacting surfaces where stiction generally occurs. In one example, aspects of this invention may be especially useful for fabricating and using micromechanical devices, such as MEMS devices, NEMS devices, or other similar thermal or fluidic devices. In one embodiment, an amount of the lubricant is preferentially deposited in various regions within the device so that the "fresh" lubricant can ready diffuse or be transported in a gas or vapor phase to all areas of the processing region to minimize the interaction of the moving components and thus reduce the chances of stiction-related failure. In another embodiment, the lubricant is preferentially deposited in desired regions of the device so that the interaction of the various moving components in the device can be minimized. In another embodiment, two or more different types of lubricant molecules are preferentially deposited in desired regions of the device to provide multiple lubricants that reduce the interaction of the various moving components in the device. One of skill in the art will recognize that the term lubricant, as used herein, is intended to describe a material adapted to provide lubrication, anti-stiction, and/or anti-wear properties. In addition, the term lubricant, as used herein, is generally intended to describe a lubricant that is in a liquid, vapor and/or gaseous state during the operation and storage of a device.

Overview of Exemplary System

Figure 1A:
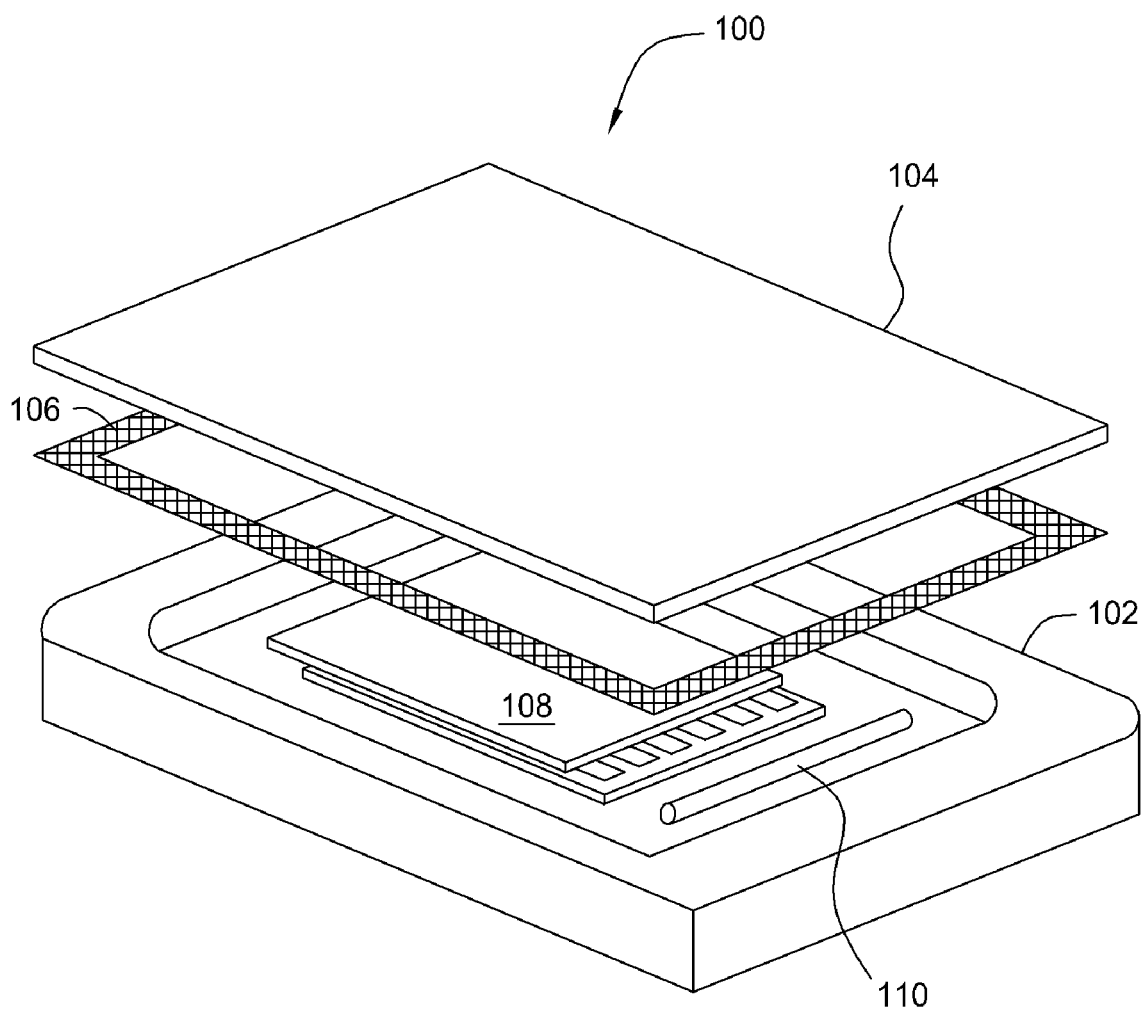
FIG. 1A schematically illustrates a cross-sectional view of a prior art device package containing a getter.
Figure 1B:
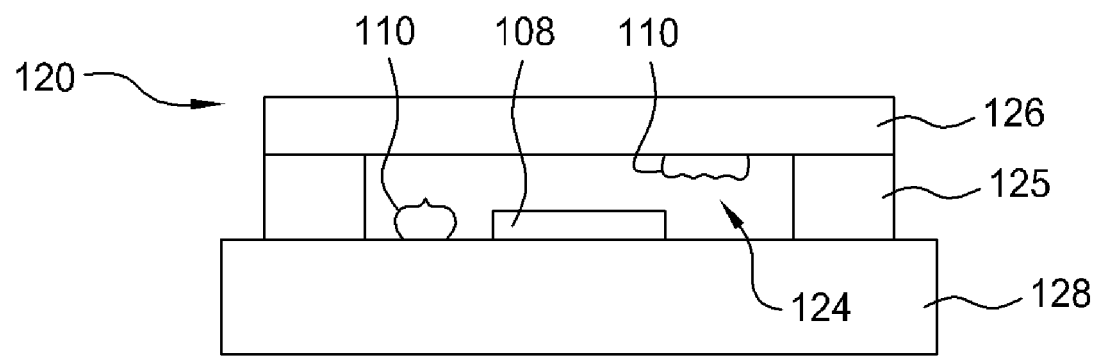
FIG. 1B schematically illustrates a cross-sectional view of another prior art device package containing a getter.
Figure 2A:
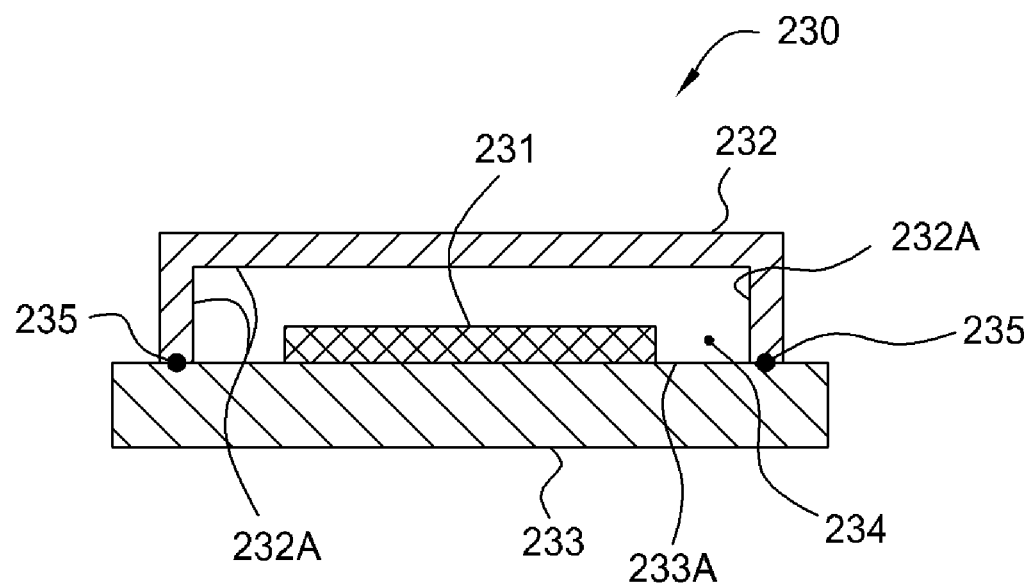
FIG. 2A schematically illustrates a cross-sectional view of a single mirror assembly 101 according to this invention.

In an effort to prevent contamination from affecting the longevity of MEMS or NEMS components, these devices are typically enclosed within an environment that is isolated from external contamination, particles or other material that can affect the longevity of the formed device. FIG. 2A illustrates a cross-sectional view of a typical MEMS device package 230 that contains a MEMS device 231 that is enclosed within a processing region 234 formed between a lid 232 and a base 233. Typically, the lid 232 or other components are bonded to the base 233 using a seal 235 that hermetically or non-hermetically seals the processing region 234 so that the components within the processing region 234 are isolated from external contaminants and particles that may interfere with the use of the device.

Figure 2B:
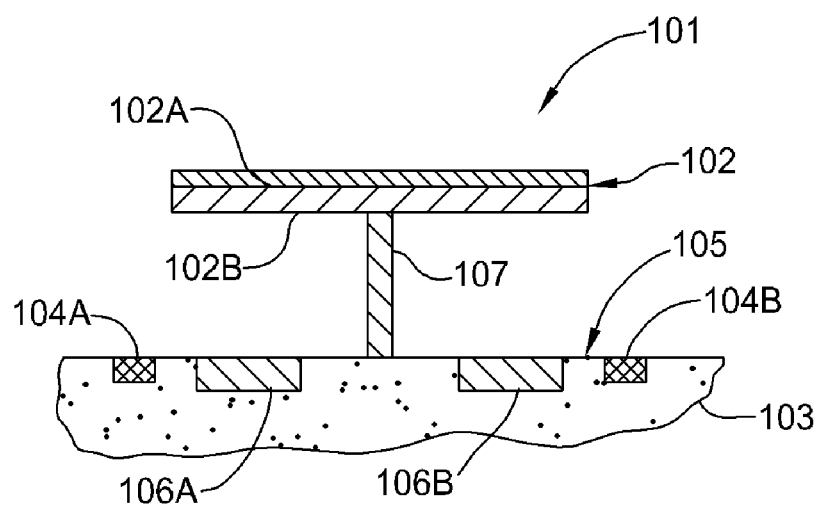
FIG. 2B schematically illustrates a cross-sectional view of a single mirror assembly 101 in a non-deflected state, according to one embodiment of the invention.

FIG. 2B illustrates a representative micromechanical device that may be formed within the MEMS device 231 (FIG. 2A), which is used herein to describe various embodiments of the invention. The device shown in FIG. 2B schematically illustrates a cross-sectional view of a single MEMS device, such as a single mirror assembly 101 contained in a spatial light modulator (SLM). Typically, a MEMS device contains one or more moving parts that contacts or interacts with one or more surfaces found in the device during device operation. The internal surface area of the packaged MEMS/NEMS component can be divided into the "contacting-surfaces" such as 102B and 104A in FIG. 2C, and "non-contacting surfaces" like, for example, the top surfaces of electrodes 106A-106B, the surface of the flexible member 107, and the reflective surface 102A. In general, the total non-contacting area is several orders of magnitudes greater than the contacting surface area. One should note that the MEMS device shown in FIG. 2B is not intended in any way to limit the scope of the invention described herein, since one skilled in the art would appreciate that the various embodiments described herein could be used in other MEMS, NEMS, larger scale actuators or sensors, or other comparable devices that experience stiction or other similarly related problems. While the discussion below specifically discusses the application of one or more of the various embodiments of the invention using a MEMS or NEMS type of device, these configurations also are not intended to be limiting as to the scope of the invention.

In general, a single mirror assembly 101 may contain a mirror 102, base 103, and a flexible member 107 that connects the mirror 102 to the base 103. The base 103 is generally provided with at least one electrode (elements 106A or 106B) formed on a surface 105 of the base 103. The base 103 can be made of any suitable material that is generally mechanically stable and can be formed using typical semiconductor processing techniques. In one aspect, the base 103 is formed from a dielectric material, such as a silicon dioxide, and processed according to standard semiconductor processing techniques. Other insulating materials may be used in alternative embodiments of the invention. The electrodes 106A, 106B can be made of any materials that conduct electricity. In one aspect, the electrodes 106A, 106B are made of a metal (e.g., aluminum, titanium) preferentially deposited on the surface 105 of the base 103. A MEMS device of this type is described in the commonly assigned U.S. patent application Ser. No. 10/901,706, filed Jul. 28, 2004.

The mirror 102 generally contains a reflective surface 102A and a mirror base 102B. The reflective surface 102A is generally formed by depositing a metal layer, such as aluminum or other suitable material, on the mirror base 102B. The mirror 102 is attached to the base 103 by a flexible member 107. In one aspect, the flexible member 107 is a cantilever spring that is adapted to bend in response to an applied force and to subsequently return to its original shape after removal of the applied force. In one embodiment, the base 103 is fabricated from a first single piece of material, and the flexible member 107 and the mirror base 102B are fabricated from a second single piece of material, such as single crystal silicon. As previously stated, the use of any configuration that allows the surface of one component (e.g., mirror 102) to contact the surface of another component (e.g., base 103) during device operation generally falls within the scope of the invention. For example, a simple cantilever beam that pivots about a hinge in response to an applied force such that one end of the cantilever beam contacts another surface of the device is within the scope of the invention.

In one aspect, one or more optional landing pads (elements 104A and 104B in FIG. 2B) are formed on the surface 105 of the base 103. The landing pads are formed, for example, by depositing a metal layer containing aluminum, titanium nitride, tungsten or other suitable materials. In other configurations, the landing pads may be made of silicon (Si), poly-silicon (poly-Si), silicon nitride (SiN), silicon carbide (SiC), diamond like carbon (DLC), copper (Cu), titanium (Ti) and/or other suitable materials.

Figure 2C:
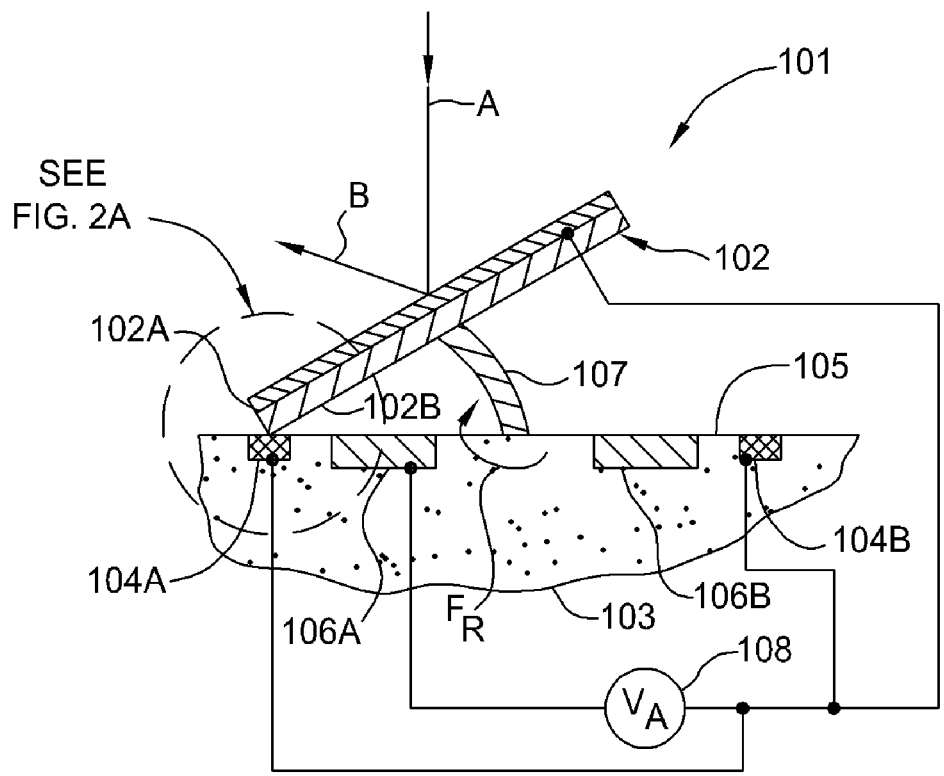
FIG. 2C schematically illustrates a cross-sectional view of a single mirror assembly 101 in a deflected state, according to one embodiment of the invention.

FIG. 2C illustrates the single mirror assembly 101 in a deformed state due to the application of an electrostatic force $F_E$ created by applying a voltage $V_A$ between the mirror 102 and the electrode 106A using a power supply 108. As shown in FIG. 2C, it is often desirable to bias a landing pad (e.g., elements 104A) to the same potential as the micro-mirror 102 to eliminate electrical breakdown and electrical static charging in the contacting area relative to mirror 102. During typical operation, the single mirror assembly 101 is actuated such that the mirror 102 contacts the landing pad 104A to ensure that a desired angle is achieved between the mirror 102 and the base 103 so that incoming optical radiation "A" is reflected off the surface of the mirror 102 in a desired direction "B." The deflection of the mirror 102 towards the electrode 106A due to the application of voltage $V_A$ creates a restoring force $F_R$ (e.g., moment), due to the bending of the flexible member 107. The magnitude of the restoring force $F_R$ is generally defined by the physical dimensions and material properties of the flexible member 107, and the magnitude of distortion experienced by the flexible member 107. The maximum restoring force $F_R$ is typically limited by the torque applied by the electrostatic force $F_E$ that can be generated by the application of the maximum allowable voltage $V_A$. To assure contact between the mirror 102 and the landing pad 104A the electrostatic force $F_E$ must be greater than the maximum restoring force $F_R$.

As the distance between the mirror 102 and the landing pad 104A decreases, the interaction between the contacting-surfaces of 102B and 104A (and 104B) generally creates one or more stiction forces $F_s$ that act on the mirror 102. When the stiction forces $F_s$ equals or exceeds the restoring force $F_R$, device failure results, since the mirror 102 is prevented from moving to a different position (or released) when the electrostatic force generated by voltage $V_A$ is removed or reduced. As previously described herein, stiction forces are complex surface phenomena that generally include three major components. The first is the so-called "capillary force" that is created at the interface between a liquid and a solid due to an intermolecular force imbalance at the surface of a liquid (e.g., Laplace pressure differences) that generates an adhesive-type attractive force. Capillary force interaction in MEMS and NEMS devices usually occurs when a thin layer of liquid is trapped between the surfaces of two contacting components. A typical example is the water vapor in the ambient environment. The second major component of stiction forces is the Van der Waal's force, which is a basic quantum mechanical intermolecular force that results when atoms or molecules come very close to one another. When device components contact one another, Van der Waal's forces arise from the polarization induced in the atoms of one component by the presence of the atoms of the second component. When working with very planar structures, such as those in MEMS and NEMS devices, these types of stiction forces can be significant due to the size of the effective contact area. The third major component of stiction forces is the electrostatic force created by the coulombic attraction between trapped charges found in the interacting components.

Figure 3A:
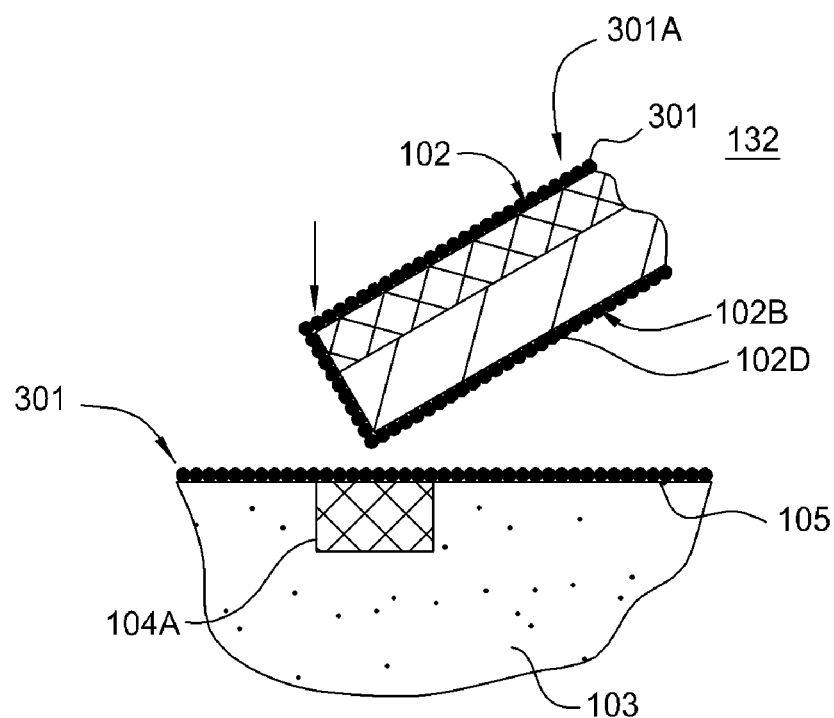
FIG. 3A illustrates a close-up cross-sectional view of a single mirror assembly 101, according to one embodiment of the invention.

One solution to reduce stiction forces created between interacting components is to coat the surface of the interacting components with an organic coating, which is hereafter referred to as a "lubricant coating". FIG. 3A is a close-up side cross-sectional view of the deflected single mirror assembly 101 that has been coated with an organic layer, or lubricant coating 301. The lubricant coating 301 covers the interacting surfaces of the mirror 102 and the landing pad 104A. It should be noted that the term "layer," as used herein, is intended to describe a monolayer as well as an aggregation of material that may be many molecules in thickness. While FIG. 3A illustrates the lubricant coating 301 disposed on both interacting surfaces, such as the mirror 102 and the landing pad 104A this configuration is not intended to be limiting as to the scope the invention described herein. Therefore, in general, the lubricant coating 301 may be applied to one or more of the interacting surfaces.

As shown in FIG. 3A, the lubricant coating 301 is used to modify the surfaces of the mirror 102 and the landing pad 104A to reduce their respective surface energies, thereby further decreasing the likelihood of stiction-related failures. It is believed that by adding the lubricant coating 301 to the contacting surfaces the lubricant coating 301 is able to make the surfaces more hydrophobic, which reduces capillary-type stiction forces. It is also believed that the lubricant coating 301, when chosen properly, can impede the generation of Van der Waal's forces created between the atoms of the mirror 102 and the landing pad 104A and also reduce the coulombic attraction between the atoms of the mirror 102 and the landing pad 104A by reducing the potential differences between the surfaces of these two components.

Figure 3B:
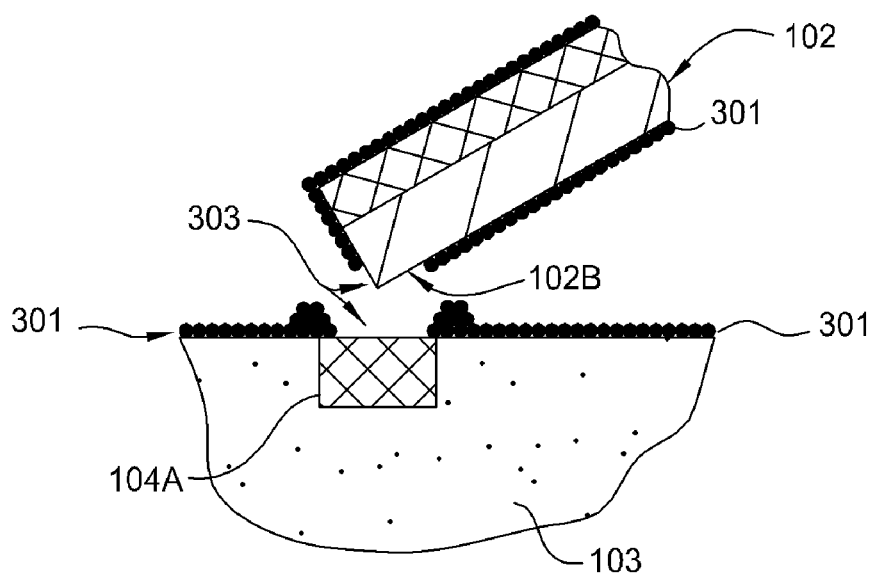
FIG. 3B illustrates a close-up cross-sectional view of a single mirror assembly 101, according to one embodiment of the invention.

While the lubricant coating 301 can be effective in reducing the stiction type failures, these types of coatings generally have a very limited usable lifetime, since they are easily damaged or displaced due to the impact or wear created by the interaction of the various moving components. FIG. 3B illustrates close-up of the deflected single mirror assembly 101 that has a lubricant coating 301 that has become damaged due to the interaction of the moving components. Due to the repetitive interaction of the components in the single mirror assembly 101, exposed regions 303 on the landing pad 104A and mirror base 102B are formed in the damaged the lubricant coating 301. The exposed regions 303 on the landing pad 104A and mirror base 102B are susceptible to stiction type failures. This type of coating failure inevitably occurs in MEMS devices, such as a light modulator, that are subject to frequent contact during operation (e.g., 3000-5000 contacts/sec) and a large number of contacts during the product lifetime (e.g., 100 billion contacts). Without some way of reliably restoring or repairing the damaged coatings, stiction inevitably results, leading to device failure.

In one embodiment, one or more types of lubricant molecules are used to repair the damaged regions of a lubricant coating 301 or to reduce the interaction between two contacting surfaces of a MEMS device. Referring again to FIG. 2A-2C, the internal surface area of the device package is typically several orders of magnitude greater than the surface area of the contact regions formed between moving parts within the MEMS device. Embodiments of the invention described herein utilize the internal surfaces of a device package, such as the MEMS device package 230, to store the lubricating materials that are used to prevent stiction between interacting components. The lubricant stored on the internal surfaces is able to act as a ready supply of lubricating material to the contacting regions. More specifically, the lubricating material stored on the non-contacting surfaces within the processing region 234 are used to store excess lubricant molecules, which over time are released into the processing region 234 to repair or replenish damaged lubricant materials found within at the contacting area. The internal surface area, as shown in FIG. 2, generally includes the lid surface 232A, the base surfaces 233A and/or unused portions (not shown) of the MEMS device 231, which are in contact with the processing region 234. These internal surfaces are generally formed from different surface materials, such as metals, dielectrics materials, glass, ceramic materials, and semiconductor type materials.

Figure 4:
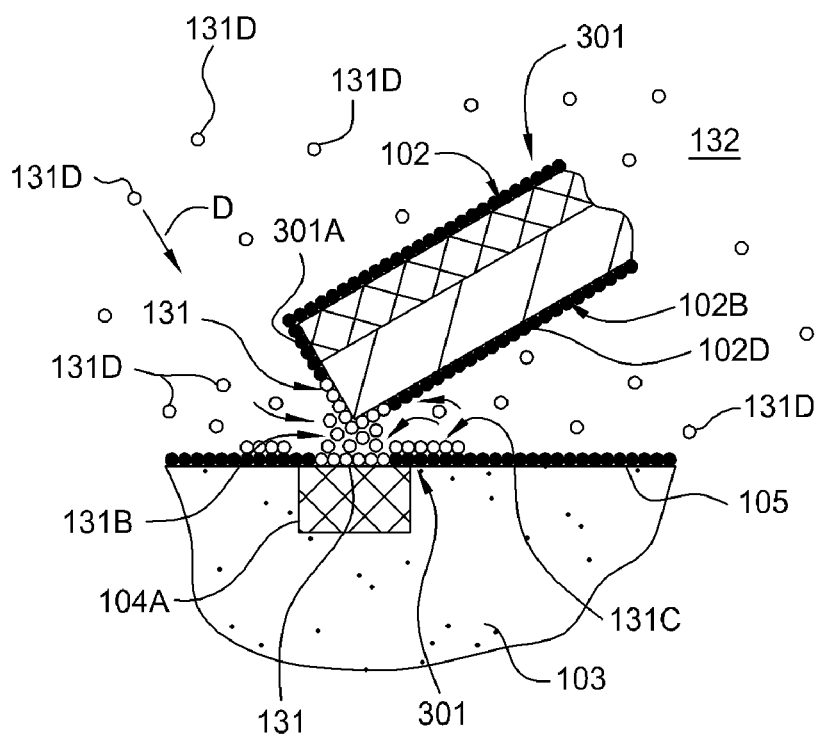
FIG. 4 illustrates a close-up cross-sectional view of a single mirror assembly 101 that has a damaged coating, according to one embodiment of the invention.

In one embodiment, the lubricant molecules are made of different materials than a lubricant coating 301 and disposed on the internal surface area of the device package are used to replenish and repair the damaged regions of the lubricant coating 301 as shown in FIG. 3B. In another embodiment, the lubricant molecules are made of same material as the lubricant coating 301. The movement or migration of the lubricant molecules is performed by generally two transportation mechanisms. The first mechanism is a surface diffusion mechanism, where the lubricant molecules diffuse across the internal surface(s) of the device to reach a damaged or exposed contact region. In one aspect, the lubricant molecules are selected for its good diffusivity over the lubricant coating 301 surfaces. FIG. 4 illustrates a group of lubricating molecules 131C migrating towards the damaged regions of the lubricant coating 301 (e.g., see lubricant molecules 131C) over the lubricant coating 301 surface. In general, the movement or migration of lubricant molecules is governed by Fick's first law:

$$J=-D(dC/dx)$$

where J is the flux of lubricant molecules (atoms/m$^2$·s), D is the diffusion coefficient (m$^2$/s), C is the concentration (atoms/m$^3$) and X is the length (m) in the direction of movement. As indicated, the greater the concentration of lubricant molecules in the non-contacting surface areas of the device package versus the damaged or exposed regions of the device, the higher the average diffusion or migration rate of the lubricant molecules towards the damaged regions.

The second mechanism is a vapor phase, or gas phase, migration of the lubricant molecule 131D stored in other areas of the device package 230 to the damaged regions of the lubricant coating 301, as exemplified by lubricant molecules 131 in FIG. 4. In one aspect, the lubricant molecule stored in an unused area of the device package are selected so that they detach and/or desorb from these areas and enter into the process region 234 of FIG. 2A, which surrounds the MEMS components, as a vapor or gas. During operation of the device, the lubricant molecules 131D reach an equilibrium partial pressure within processing region 234 and then, in a vapor or gaseous state, migrate to a damaged area of a lubricant coating 301 or between the interacting surfaces, as depicted by lubricant molecules 131B in FIG. 4.

Therefore, disposing the lubricant molecules on the non-contacting surfaces of the device is advantageous over the localized storage device schemes, such as conventional zeolite, microtube or other getter packaging schemes that are described in the prior art, since transporting the lubricant molecule from a distant getter relies primarily on the second mechanism, that is the vapor transport.

Therefore, since these two types of transport mechanisms tend to aid in the building up of a lubricant layer, which reduces the interaction of the moving MEMS components, the act of "fixing" an exposed region of the MEMS device is generally referred to hereafter as "replenishment" of the lubricant layer, and the migrating lubricants by either transportation mechanism are referred to as a "mobile lubricant" (e.g., mobile lubricants 131). Generally, a sufficient amount of replenishing lubricant molecules are stored inside the device package so that they are available to prevent stiction type failures at the interacting areas of the MEMS device during the entire life cycle of the product.

In one embodiment, the lubricating molecules stored on the non-contacting surfaces of the processing region 234 comprise a long-chain organic molecule material that has an appropriate functional head-group selected so that the internal surfaces of the processing region 234 can be fully saturated with the lubricant molecules. In such a configuration, the organic molecule can be specifically selected and used to form a single monolayer over a desired surface of the device. In one aspect, the organic molecules of the monolayer coating are selected for their affinity to form a bond to a desired exposed material in the processing region 234 rather than to itself or other like molecules. In one embodiment, during normal operation, the deposited organic molecules detach, or desorb, from the non-contacting surface(s) and diffuse to all areas of the processing region 234 to minimize the interaction of the moving components and thus reduce the chances of stiction-related failure.

The lubricant molecules may be used to enhance the lifetime of the MEMS device that has a degraded solid or liquid lubricant coating, by reducing the amount of wear experienced by the lubricant coating during operation. In one aspect, the lubricant molecules may accumulate as a lubricant molecule group 131B that acts as a "buffer" or "bumper" between the mirror 102 and the landing pad 104A, further reducing the probability of stiction-related failures. The ability of the lubricant to act as a "buffer" or "bumper" between the interacting surfaces may be due to the relatively large size of the molecules in the lubricant with high molecular weight (e.g., >100 amu). The buffering property of the lubricant may be present even in the absence of the formation of an adsorbed layer. In another aspect, the mobile lubricant may also form multiple adsorbed layers that supplement the lubrication/anti-stiction/anti-wear properties of the lubricant or other added lubricating materials.

Lubricant Reservoirs

To achieve self-repair or replenishment of the exposed regions of the lubricant coating on contacting surfaces of MEMS device, a sufficient amount of excess lubricant molecules in the device package are needed to assure that enough "fresh" lubricant is available to prevent stiction related failures throughout the life of the MEMS device. To solve this problem, conventional devices usually employ some type of reversibly absorbing getter, such as the ones found in U.S. patent application Ser. No. 6,843,936 and U.S. patent application Ser. No. No. 6,979,893, to store the lubricant molecules in a zeolite crystals or internal volume of a micro-tube. However, as previously described, adding the reversibly absorbing getter, to retain the liquid lubricants increases package size and packaging complexity and adds steps to the fabrication process, thereby increasing piece-part cost as well as the overall manufacturing cost of MEMS or NEMS devices. Thus, forming a device that uses these techniques generally requires a number of labor intensive and costly processing steps, such as mixing the getter material, applying the getter material to the device containing package, curing the getter material, conditioning or activating the getter material, and then sealing the MEMS device and the getter within the sealed package.

To resolve these issues, embodiments of the invention utilize the non-contacting surface areas within the device package to store excess molecules that can be released within the enclosed package to repair or replenish damaged molecules at various contacting areas. The internal surface area of the packaging and MEMS/NEMS components is typically several orders of magnitudes greater than the total contacting surface areas, even in small packages.

Figure 5A:
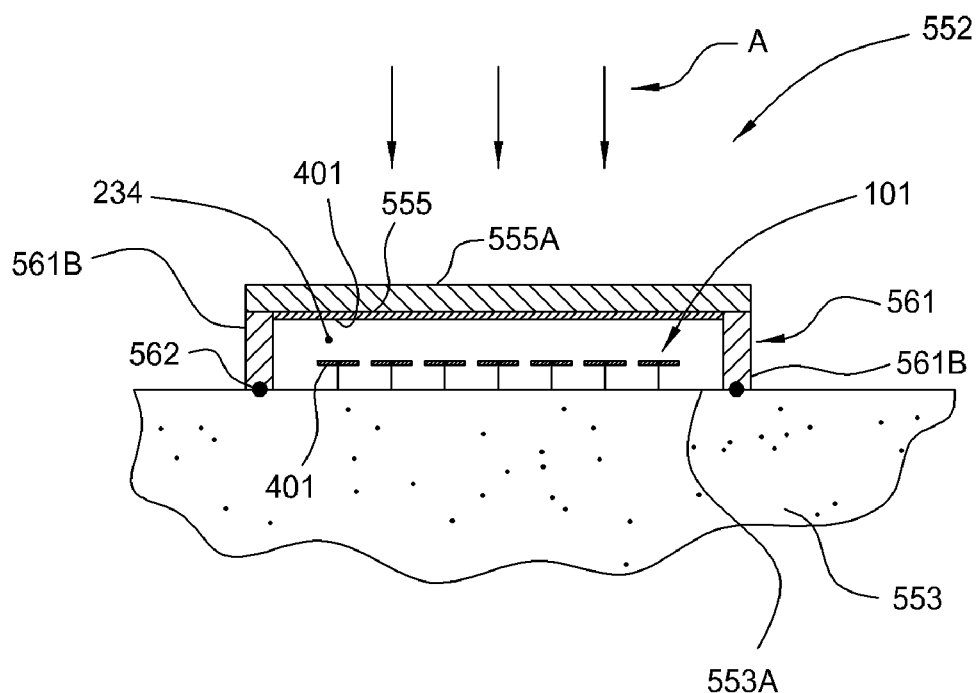
FIG. 5A illustrates a cross-sectional view of a device package assembly, according to one embodiment of the invention.

FIG. 5A illustrates one embodiment of the invention in which a lubricant layer 401 is preferentially deposited on various surfaces or regions of a formed device package 552 containing an array of single mirror assemblies 101 positioned within a processing region 234. As shown, the processing region 234 is formed between a lid assembly 561 that is sealably coupled to a substrate 553 by use of a sealing member 562. The sealing member 562 can be used to form either a hermetic or a non-hermetic seal between the lid assembly 561 and the substrate 553. In general, during the process of forming the device package 552 one or more processing steps are performed to preferentially deposit the lubricant layer 401 on one or more surfaces within the processing region 234 before, during or after the sealably coupling the lid assembly 561 to the substrate 553. In the formed device package 552, the regions containing the lubricant layer 401 are advantageously used to provide a ready supply of a mobile lubricating material for the replenishment of the damaged lubricant at the contacting areas. Typically, conventional sealing processes, such as anodic bonding, glass frit bonding and/or eutectic bonding that may be used to bond lid assembly 561 to the substrate 553, require that the MEMS device, lubricant materials, and other device components be heated to temperatures between about 350° C. to about 450° C. These high-bonding temperatures severely limit the type of lubricants that can be used in a device package and also cause the lubricant to break down after a prolonged period of exposure. An example of one or more methods that can be used form a sealed MEMS device is further described in the commonly assigned United States Patent Application Publication No. 20060024919, filed Jul. 28, 2004, and the commonly assigned United States Patent Application Publication No. 20060141745, filed Dec. 23, 2004, which are both herein incorporated by reference.

In one embodiment, various surfaces within the processing region 234 are coated with one or more types of lubricant materials that selectively form a strong bond to the contacting surfaces and a weak bond to the non-contacting or storage surfaces. The lubricant molecules that are weakly bonded to the non-contacting surfaces are adapted to, during normal operation of the device, diffuse away from and/or desorb from these storage surfaces (e.g., lubricant 131C and 131D in FIG. 4), so that they can act as a mobile lubricating material.

The large non-contacting (unused or underutilized) areas within a device package 552 are used to form a ready reservoir of lubricant containing a high concentration of lubricating material. In such a configuration, the formed reservoir(s) releases the lubricant material into the processing region 234 as the lubricant material breaks down or reacts with other components in the processing region 234. In one aspect, the lubricant layer 401 may be deposited on various regions of the device package to prevent the interaction of various components and thus stiction related failures. The embodiments described herein reduce the complexity of the formed device package and device packaging process, since they do not require the positioning of external components, such as getter materials that contain a lubricant, within the processing region of the device package during fabrication. Also reduced are the number of components within the device package. Thus, cost to produce such a device package may be substantially reduced. The embodiments described herein also improve device yield and device reliability by reducing the likelihood that external components positioned within the processing region, such as getter materials, contact the moving or interacting components within the formed device package during operation. Embodiments of the invention also allow the lubricants to be positioned in the device package after the enclosure that surrounds the MEMS device has been formed, so as to minimize the breakdown of the mobile lubricant due to high temperature exposure during the packaging process.

A device package 552, as shown in FIG. 5A, that can benefit from the various embodiments described herein is a spatial light modulator (SLM) device. In one example, a SLM device contains a substrate 553 and the lid assembly 561 that contains an optically transparent region 561A made of a display grade glass (e.g., Corning® Eagle 2000™) with anti-reflective coating and a standoff element 561B made of a suitable material, such as silicon. Referring to FIGS. 2A and 5A together, the surface of the mirror 102A, the landing pad 104A and the electrodes 106A and 106B are typically formed from or contain a metal, such as aluminum. Typically, the remaining surfaces (e.g., surface 105 of FIG. 2A and surface 553 of FIG. 5A) of the substrate contain silicon dioxide ($SiO_2$), and the backside of the mirror 102B can be silicon (Si) or other dissimilar material as the landing pad.

Figure 5B:
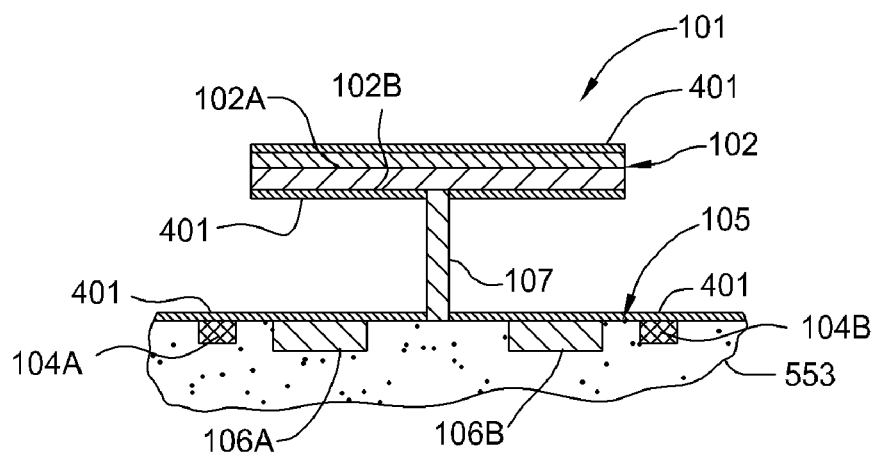
FIG. 5B schematically illustrates a cross-sectional view of a single mirror assembly 101 according to this invention.

The material differences in the various areas of the device package make it possible to selectively coat these surfaces with the same or different lubricant molecules that have a desired binding strength to these areas of the device. FIG. 5B illustrates an example, where the backside surface 102B of the mirror and the lading pads 104A and 104B are coated with lubricant layer 401, which forms a strong bond to these surfaces to provide better contact and wear durability during device operation. The remaining non-contacting surfaces, or storage surfaces, are coated with lubricant molecules that have a weaker bond strength to allow a percentage of the lubricant molecules to detached from the surface and desorb into the processing region 234 of the device package during the normal operation and function as a mobile lubricant 131. It should be noted that the formed device package 552 may contain a plurality of different lubricant molecules, and the configuration(s) set forth in FIGS. 5A-5B are not intended to limit the scope of the invention in any way.

Selective coating of lubricant molecules on various surfaces inside the device package can be completed by selecting and synthesizing long chain organic molecule lubricants that have a desired functional group (e.g., head group and end group) at one or both ends of a lubricant molecule. The functional group of the long chain organic molecule can selectively react (with or without a catalyst) with a surface forming a desired bond strength within the device package. Conventional methods of forming and synthesizing lubricant molecules that have desirable head groups are further described in the references "An introduction to ultrathin organic films from Langmuir-Blodgett to Self-Assembly" by Ulman, Academic press 1991 and "Self-Assembled Monolayer of Thiolates on Metals as a Form of Nanotechnology" J. C. Love et al. Chem Rev. 105, (1103-1169), 2005, which are incorporated by reference herein.

Figure 5C:
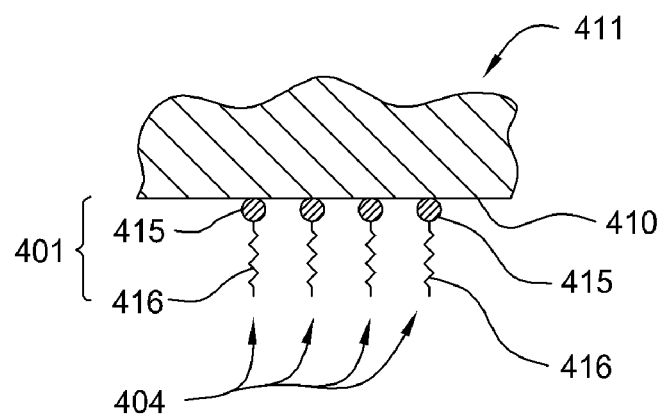
FIG. 5C schematically illustrates a cross-sectional view of a surface within a device package, according to one embodiment of the invention.

As illustrated in FIG. 5C, the head group 415 of the lubricant molecule 404 can be selected to preferentially bond with a surface 410 and form a layer of lubricant molecules 404 that have a specific bond strength (or stability) to the surface 410 through the head group 415. In one aspect, the lubricant molecule 404 has a long chain organic molecule 416 section that is used to further aid in the lubrication of the MEMS components. In one example, the head group 415 is a fluorocarbon or hydrocarbon chain that has a silane ($SiH_3$), trichlorosilane ($SiCl_3$), or oxysilane head group (e.g., $RSiX_3$, where X=H, Cl, $OCH_2CH_3$) that forms a monolayer coating on the surface of the device package, such as a $SiO_2$, indium tin oxide (ITO) and/or titanium dioxide ($TiO_2$) surfaces. In another example, the lubricant molecule is a fluorocarbon or hydrocarbon chain that has a carboxyl head group (COOH), which reacts well with metallic (e.g., Al, Ni, Ti) and silicon containing surfaces, even when these surfaces have a thin native oxide present. In one aspect, the organic molecule 416 that is attached to the head group 415 is a fluorocarbon (e.g., perflourocarbon) or hydrocarbon (e.g., alkane) molecule that, when attached to surface 410 through the head group 415, may have a tail that points away from the substrate (see FIG. 5C). In one aspect, the lubricant layer 401 (FIG. 5C) is an organic coating that is self-limited to a single monolayer that has no functional groups attached to the tail end of the organic molecule 416. In one example, the head group may contain octadecyldimethylchlorosilane ($C_{18}H_{37}Si(CH_3)_2Cl$) or octadecylphosphonic acid ($C_{18}H_{37}PO(OH)_2$) that will form a direct bond with a metal oxide layer (e.g., titanium oxide ($TiO_x$)) surface.

Figure 5D:
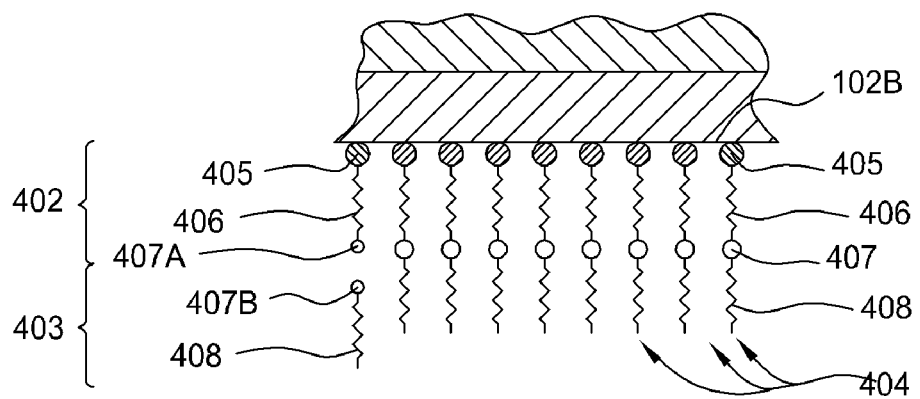
FIG. 5D schematically illustrates a cross-sectional view of a surface within a device package, according to one embodiment of the invention.

In one embodiment, the lubricating material is a long chain organic molecule that contains a linking molecule, or molecule linkers, that can be engineered as an end-group of the lubricating material to give other long chain organic lubricating molecules a place to bond to so that multiple layers of lubricating material may be formed. The ability of the lubricant molecules to link to each other allows a multilayer coating to be formed so that more lubricating molecules can be stored in the package. In one embodiment, as illustrated in FIG. 5D, the lubricant layer 401 contains multiple layers of organic molecules, where the tail end of the lubricant molecule 402 is connected to the head end of the lubricant molecule 403 by a linker 407. The linker 407, formed when the end group 407A of the lubricant molecule 402 reacts with the head group 407B of the lubricant molecule 403, facilitates the formation of a second layer of lubricating molecules. The process of adding layers of lubricant molecules 403 can be repeated to achieve the desired number of layers of lubricating molecules.

In one aspect, the lubricant layer 401 has an organic molecule 406 that is a fluorocarbon (e.g., perflourocarbon) or hydrocarbon (e.g., alkane) molecule, and a head 405 and end groups 407A that are silane based functional group such as $SiX_3$ where X=H, Cl or $CH_2CH_3$. The bond between the end group 407A of first layer of lubricant molecules 402 with the head group 407B of the second layer of lubricant molecules 403 may contain a silicon oxygen linking bond (Si—O—Si). The silane-based functional groups discussed herein are not intended to limit the scope of the invention, since a large number of functional groups can be synthesized, and a wide range of linkers can be engineered, to meet the need of a specific application of MEMS device.

Referring again to FIG. 5C, in one embodiment, the head group at one end of the lubricant molecule forms a bond with a surface within the MEMS device package with or without the use of a catalyst. The by-product of the reaction that forms the bond between the lubricant molecule 404 and the surface of the MEMS device package may be a volatile species that that can be pumped away during the deposition of the lubricant layer on the various surfaces within the device package, or remain within the device package. For this reason, it is important to choose a functional group so that the by-product does not affect the device's usable lifetime or performance. Typically, the lubricant molecules are deposited on one or more of the surfaces of the device using conventional chemical vapor deposition (CVD), a molecular beam epitaxy (MBE), or a liquid spin-on type deposition processes.

In one aspect, it is desirable to select a lubricant molecule that in addition to the direct binding of the head group to the surface, has a long chain structure, such as a perflourocarbon or a hydrocarbon, that exhibits significant van der Waals interaction with adjacent molecules, resulting in a highly ordered and tightly packaged monolayer. In general, the van der Waal forces are proportional to the number of C—F or C—H segments in the long chain molecule structure. The interaction of the segments adds to the total binding strength of the lubricant molecules.

Figure 5E:
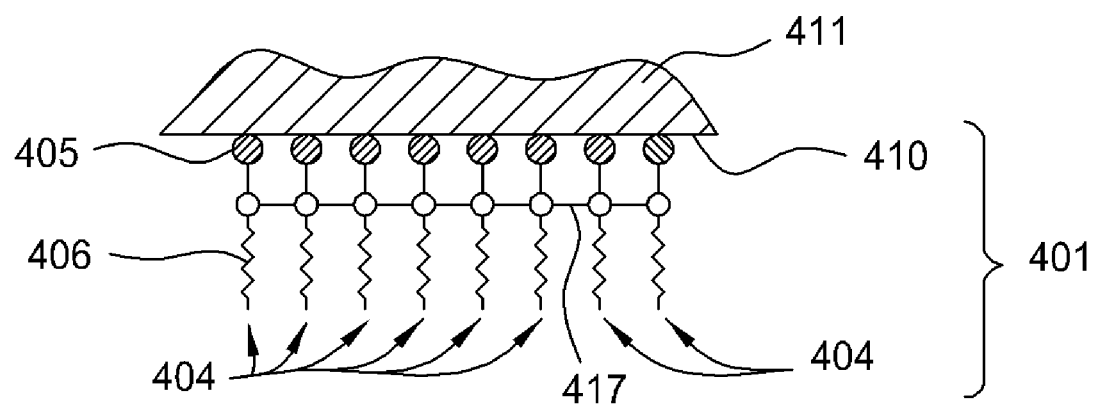
FIG. 5E schematically illustrates a cross-sectional view of a surface within a device package, according to one embodiment of the invention.

Referring now to FIG. 5E, in another embodiment, the proper selection of the functional group in the head group 405 results in a cross link, such as forming a chemical bond 417, with its neighboring lubricant molecules 404. The cross link, or chemical bond 417, helps to create an ordered lubricant layer 401 as well adding to the binding strength of the lubricant molecule to the surface on which it is deposited.

Figure 5F:
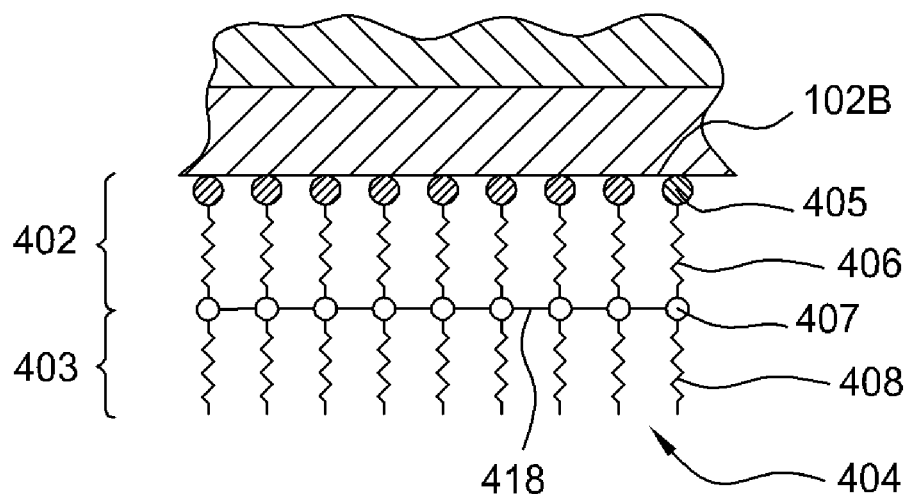
FIG. 5F schematically illustrates a cross-sectional view of a surface within a device package, according to one embodiment of the invention.
Figure 5G:
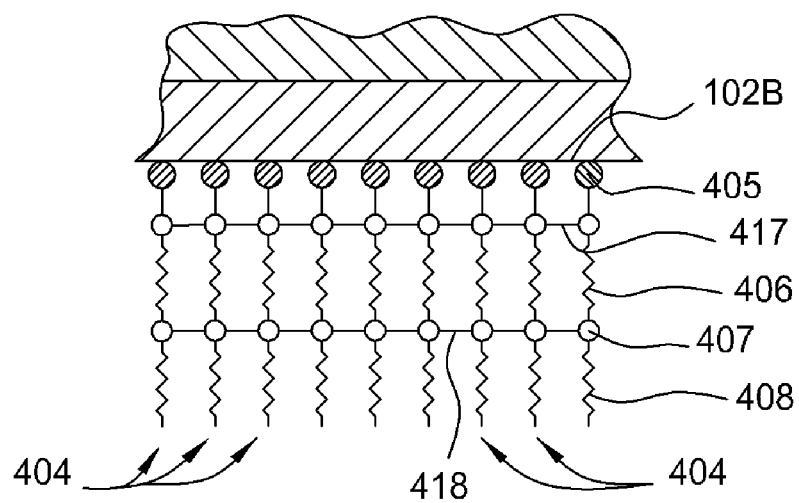
FIG. 5G schematically illustrates a cross-sectional view of a surface within a device package, according to one embodiment of the invention.

In yet another embodiment, a chemical bond 418 is formed to cross link the lubricant molecules at the linker 407 region as shown in FIG. 5F. In yet another embodiment, a chemical bond 417 is formed near the head group 405 region, and a chemical bond 418 is formed near the linker region 407 of the lubricant molecules, as shown in FIG. 5G. The cross linking functional groups may tend to cause the lubricant molecules to bind together when they are break away from the surface of a substrate. Therefore, the overall bond strength of a lubricant molecule to a surface is controlled by the strength of the cross linking bonds, the Van der Waal interaction of the lubricant molecules, the head group bond strength to the surface to which it is bonded, and/or the bond strength at the linker region of the molecule. Generally, the bond strength will vary due to the lubricant molecular structure (chain length in particular), the type of functional groups used for the head group and end group, and the material of the surfaces to which these groups are bound. By tailoring or adjusting the types of bonds and cross linking bonds formed, a lubricant molecule can be engineered that tightly bonds to the contact areas and weakly bonds to the storage areas. It should be noted that the equilibrium partial pressure of the lubricant molecules contained within the processing region 234 at a given operating temperature can be controlled by the proper selection of a head group or end group, or adjusting the degree of cross linking between adjacent lubricant molecules. One example of lubricant molecules that have different bond strengths on metal dioxide surfaces ($MO_x$) are perflorodimethylsiloxane ($Si(CH_2)_2C_6F_{13}$), which forms a much stronger bond than $SiC_8H_{17}$. A measure of bond strength is related to the temperature at which a molecule desorbs from a surface. The $Si(CH_2)_2C_6F_{13}$ lubricant molecule desorbs at a temperature of about 390° C. from a titanium oxide surface while $SiC_8H_{17}$ desorbs at a temperature of about 300° C. In another example, it is believed that the desorption rate of a $C_{18}H_{37}$ molecule from a titanium oxide surface (e.g., $TiO-C_{18}H_{37}$) is three times higher than that of $(CH_2)_2C_6F_{13}$ from a similar surface (e.g., $TiO-(CH_2)_2C_6F_{13}$).

An example of a head group that can be used with the cross linking organic coating is $C_{18}H_{37}SiX_3$.(X=H, Cl, $OCH_3$). It is believed that when this type of head group react with a metal oxide surface, such as titanium dioxide ($TiO_2$), the adjacent lubricant molecules form cross linking bonds (i.e., Si—O—Si bonds) while also forming the silicon metal oxide bonds (i.e., Si—O—Ti bonds). Similar cross linking can occur at the linker when this type of functional group is used as the end/head groups.

Referring back to FIG. 5D, in one embodiment, the bond strength of the linker 407, which binds the two adjacent lubricant molecule layers together, can be tuned by the choice of the end group 407A and the head group 407B. In one embodiment, the bond at the linker 407, which is between the end group 407A and the head group 407B, is purposefully made weaker than the bonding strength of the head group 405 to the surface 410 so that the bond at linker 407 site breaks before the bond at the head group 405. In one aspect, the linker 407 bond is selected so that it is broken during normal operation of the device, and thus allows the lubricant molecule 408 to desorb into the processing region 234 of the device 552 so that it can act as the mobile lubricant 131 shown in FIG. 4. In this case, the linking group 407 and lubricant molecule 408 may detach from the layer 402 when exposed to the operating temperatures or other radiation so that it can diffuse and/or desorb to form a lubricant material.

Figure 5H:
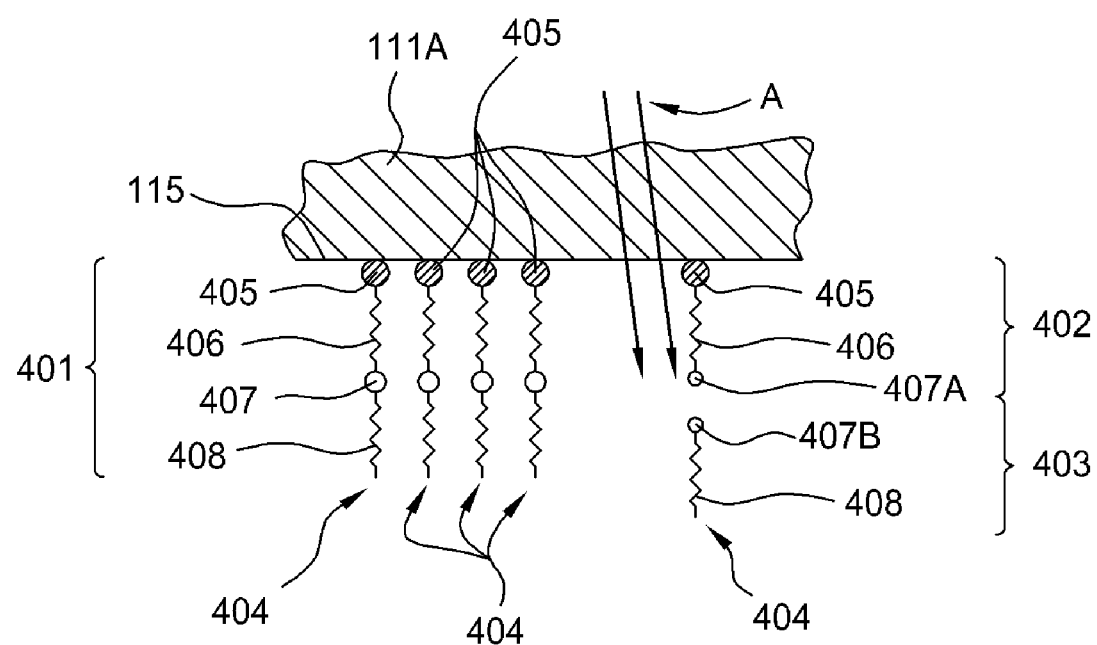
FIG. 5H schematically illustrates a cross-sectional view of a surface within a device package, according to one embodiment of the invention.

FIG. 5H illustrates a cross-sectional view of the lower surface 555 of the transparent region 561A of FIG. 5A that has a lubricant layer 401 disposed thereon. In this configuration, the head group 405 is adapted to preferentially bond to the material at the surface of the transparent region 561A, such as a glass material. In one aspect, when the lubricant molecules 404 are exposed to external radiation (e.g., optical radiation "A"), such as the signal from an electromagnetic radiation source in an SLM system, the layer 403 detaches from the layer 402 to form a mobile lubricant 131, such as lubricants 131C or 131D discussed above, that can easily diffuse around and between components to reduce stiction type failures. Again, during operation of the device, the volatile components reach an equilibrium partial pressure within the processing region. It should be noted that the energy delivered to break the bond between the layer 403 and the layer 402 at the linking group 407 may be delivered in various forms, such as electromagnetic radiation or by bringing the device and lubricant molecules up to a desired temperature.

Lubricant Properties

In general, an exemplary lubricant material, which may include lubricant molecules 404 has one or more of the following properties. First, lubricant material may have a high adsorption coefficient (i.e., large physisorption or chemisorption energy) so that the lubricant covers the exposed surfaces of the device, thereby reducing the direct interaction between contacting component surfaces during device operation. Second, the lubricant material has a low surface energy once disposed on the interacting component surfaces of a device, which reduces the stiction-related forces between the components when their surfaces are brought near each other during device operation. Third, the lubricant material may have good lubrication properties to reduce friction forces between contacting surfaces. Fourth, the lubricant material may have a lubricant part that has a low viscosity when in the gas or vapor phase to reduce any retarding force that may adversely affect the dynamic motion of device components during operation. Fifth, the lubricant material should not chemically attack or react with the materials from which the various components of the micromechanical device are made. Sixth, the lubricant material generally repels water (e.g., hydrophobic) to reduce the capillary-type stiction forces generated between the surfaces of interacting components. Seventh, the lubricant material, or portion thereof, exists as a gas or vapor at standard temperature and pressure conditions. Eighth, the lubricant material, or portion thereof, exists as a gas or vapor at standard temperature and a pressure above atmospheric pressure. Ninth, the lubricant material may have a lubricant part that exists as a gas or vapor at standard temperature and a pressure below atmospheric pressure. Tenth, the lubricant material may have a lubricant part that exists as a gas or vapor at the conditions under which it is introduced to the components to be lubricated. Eleventh, the lubricant material may have a lubricant part that exists as a gas or vapor under the operating conditions of the components to be lubricated. Twelfth, the lubricant material may have a lubricant part that exists as a gas or vapor when the components are in a non-standard operating condition (e.g., temperature or pressure is not in a desired range). Thirteenth, the lubricant material may have a lubricant part that forms a layer on components at standard temperature and pressure. Fourteenth, the lubricant material may have a lubricant part that forms a layer on components under the normal operating conditions. Fifteenth, the lubricant material may have a lubricant part that forms a layer on components under non-standard operating conditions. Sixteenth, the lubricant material is able to repair a thin film layer on a component under normal operating conditions. Seventeenth, the lubricant material repairs a thin film layer on a component under non-standard operating conditions of the component. Other factors that may be considered when selecting an appropriate lubricant material are whether the lubricant is non-toxic and whether the lubricant has a low material cost. In another aspect, an exemplary lubricant material may also be non-polar, which tends to mitigate Van der Waal-type stiction forces formed between the surfaces of interacting components.

In configurations where the lubricant material is used in optical devices (e.g., digital spatial light modulators) the lubricant material may exhibit the following additional properties: (1) the lubricant does not appreciably absorb the wavelengths of the incident or reflected optical radiation, (2) the lubricant does not fluoresce due to the exposure to the incident optical radiation, and (3) the lubricant does not breakdown due to the presence of the incident or reflected radiation (e.g., UV wavelengths).

In some configurations where the lubricant material is used in a micromechanical device the lubricant material may exhibit the following additional electrical properties: (1) the lubricant material does not ionize in an electric field up to about 300 Volts/μm, and (2) the lubricant material has good electrical insulating properties (e.g., high dielectric constant or permittivity). In one aspect, a lubricant molecule 404 is selected so that the lubricant part of the lubricant molecule 404 has a higher dielectric constant than typical gases used in conventional MEMS components, for example, nitrogen, air, argon, helium, or combinations thereof. The use of a lubricant molecule 404 that has a lubricant part that has a higher dielectric constant can be beneficial since it can allow the circuit capacitance and maximum allowable applied bias $V_A$ to increase and, thus, allows the maximum restoring force $F_R$ to be increased. One will note that capacitance, $C=\epsilon_o\epsilon_r A/d$, where $\epsilon_o$=permittivity of free space (constant), $\epsilon_r$=dielectric constant of the lubricant, A=area of electrodes and d=distance between electrodes. As previously described, by redesigning the flexible member 107 to increased restoring force $F_R$, the probability that stiction problems will arise will be reduced, since a larger stiction force would be required to cause device failure.

Lubricant Coating Methods and Device Structures

Figure 6A:
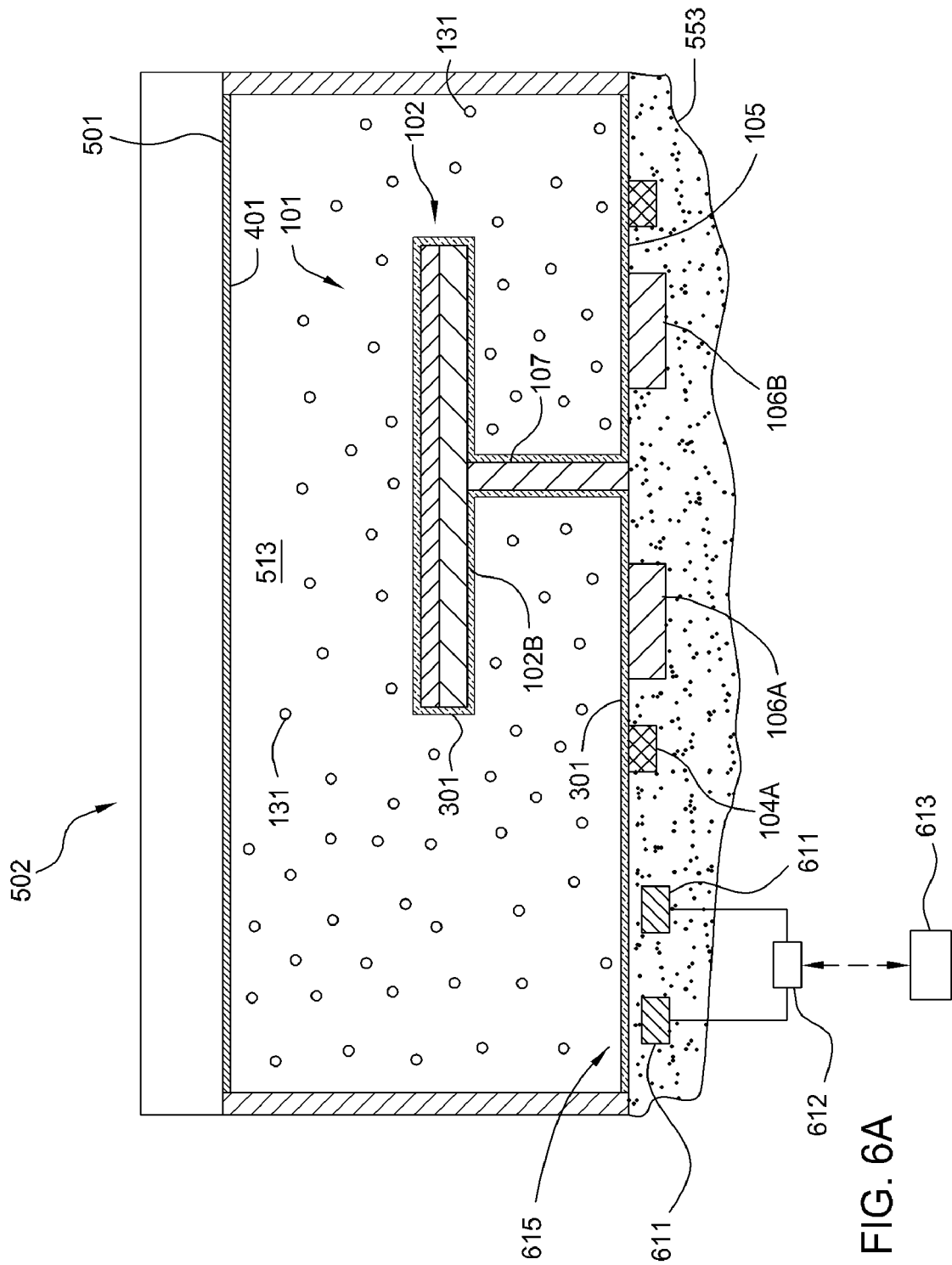
FIG. 6A illustrates a cross-sectional view of a device package assembly, according to one embodiment of the invention.
Figure 6B:
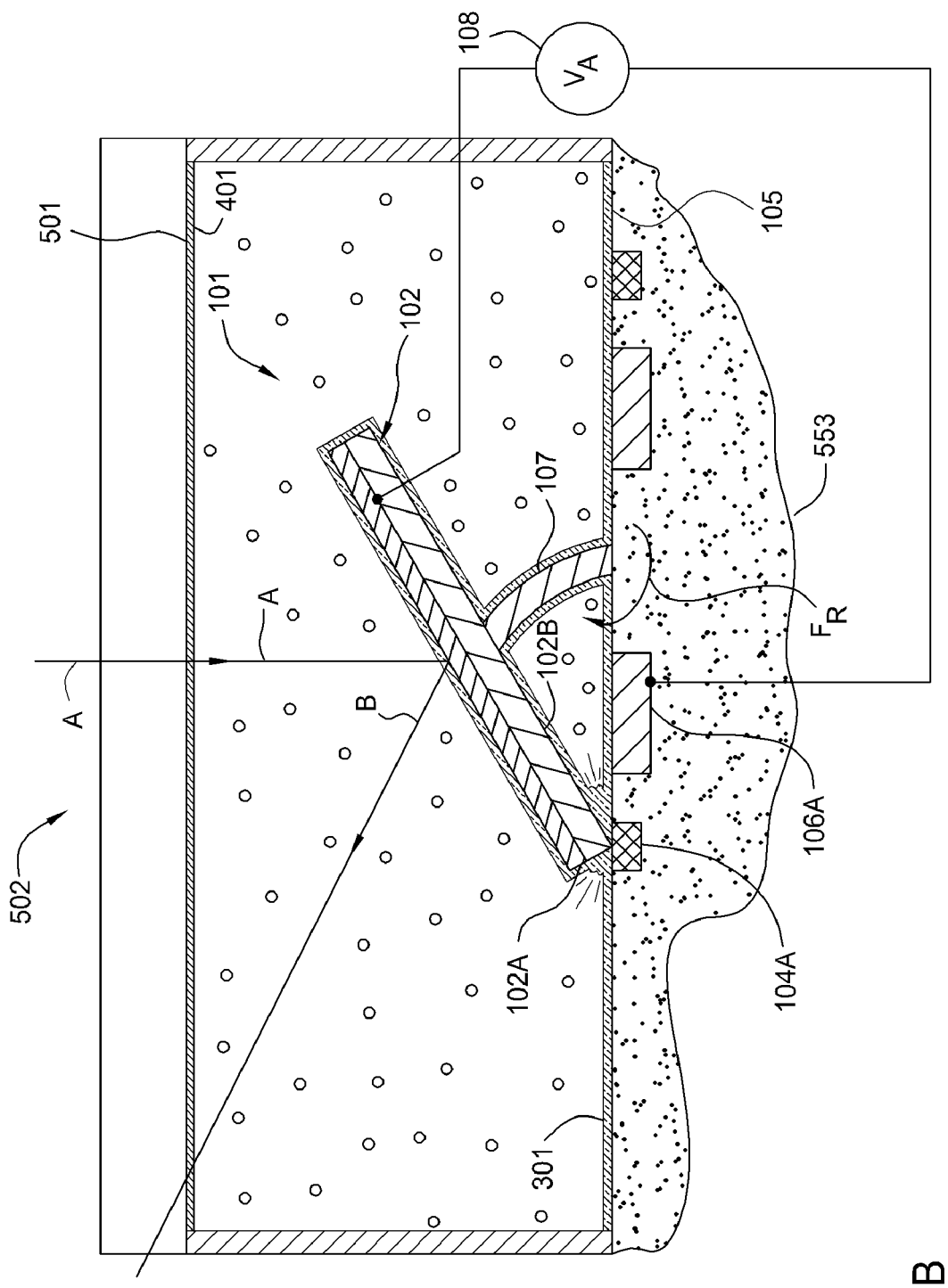
FIG. 6B schematically illustrates a cross-sectional view of a single mirror assembly 101 in a deflected state, according to one embodiment of the invention.
Figure 6C:
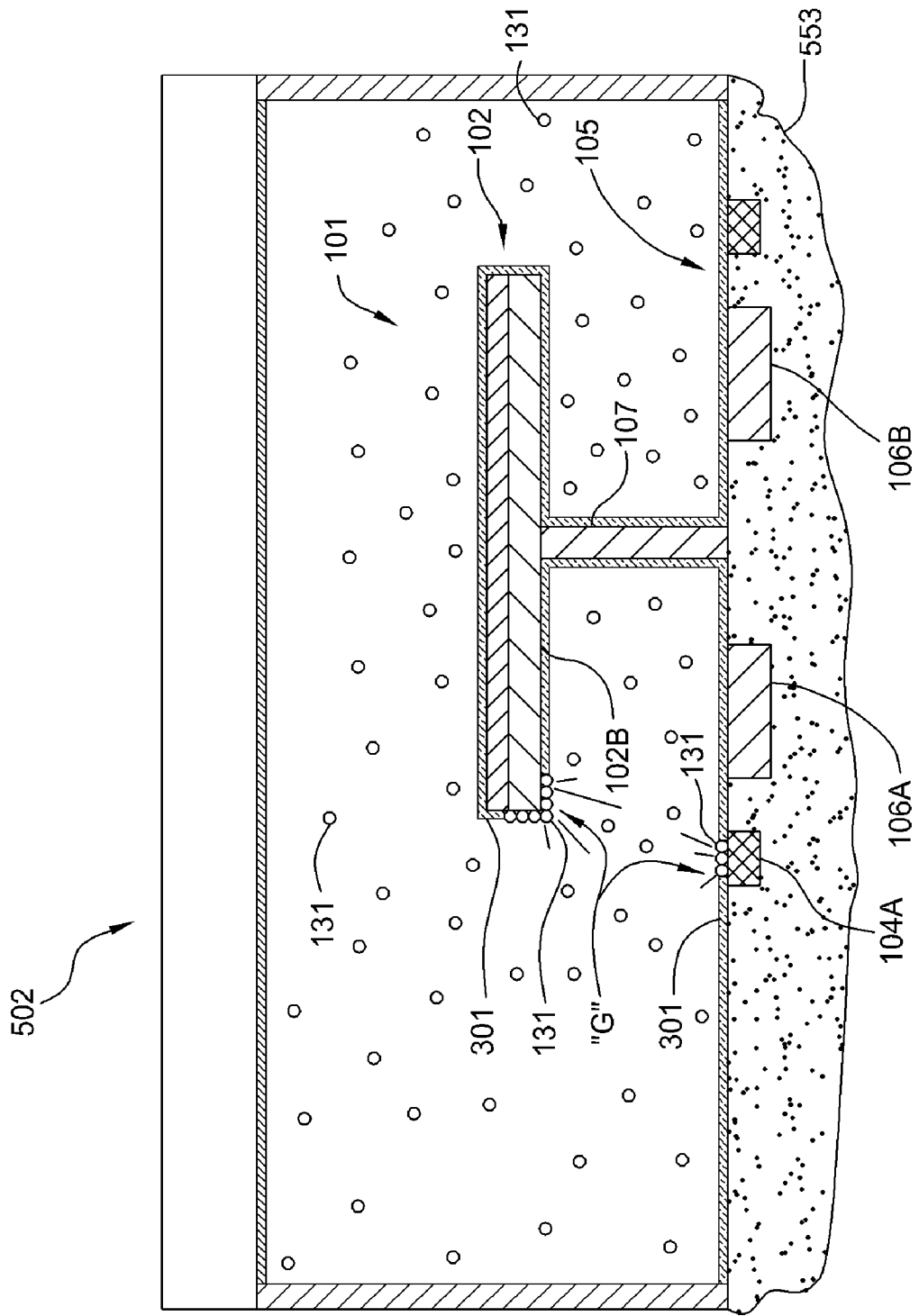
FIG. 6C schematically illustrates a cross-sectional view of a single mirror assembly 101 according to this invention.
Figure 6D:
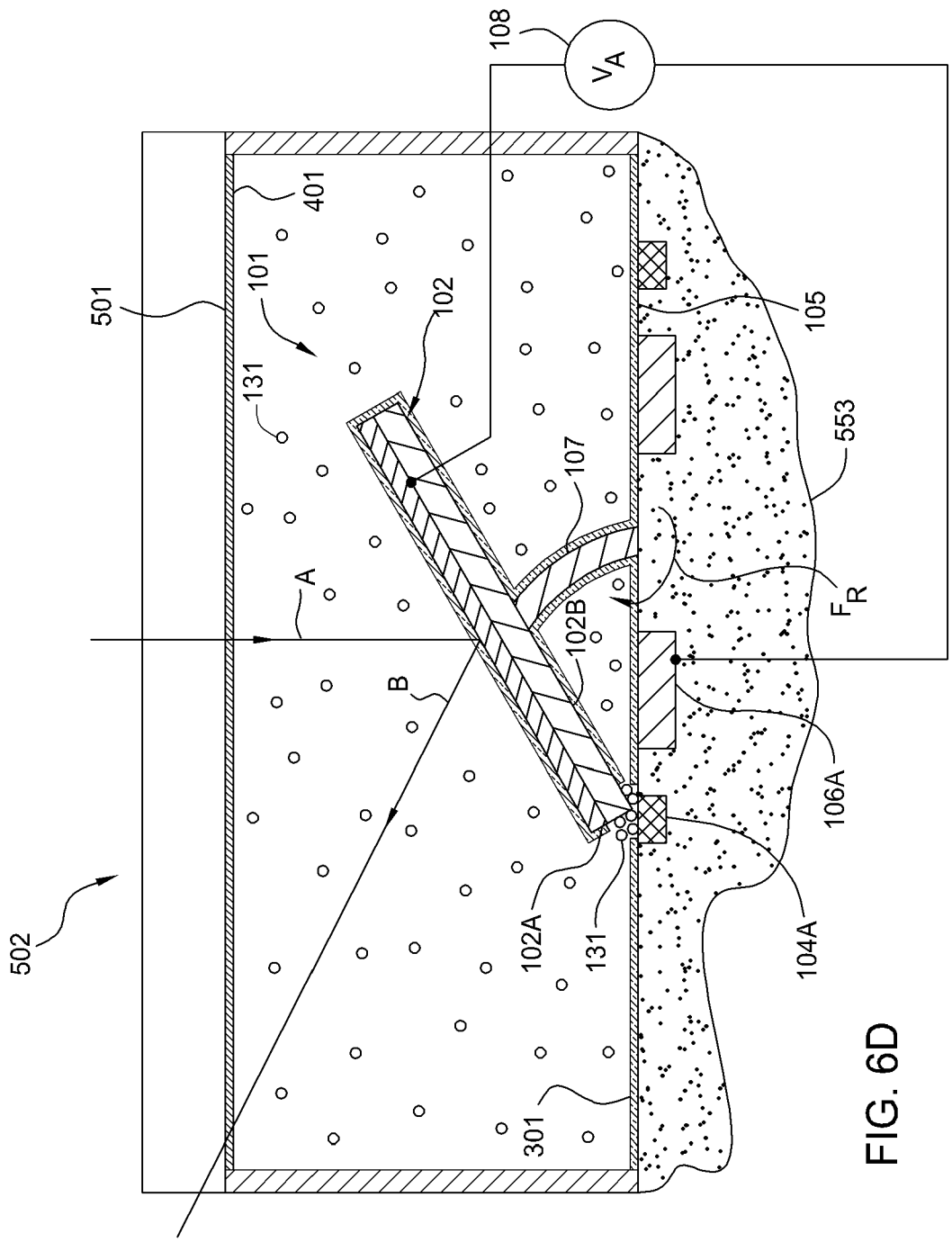
FIG. 6D schematically illustrates a cross-sectional view of a single mirror assembly 101 in a deflected state, according to one embodiment of the invention.

FIGS. 6A-6D schematically illustrate a cross-sectional view of a single MEMS device, such as a single mirror assembly 101, positioned within a device package 502 at different stages of its usable life. These figures illustrate how a damaged lubricant coating 301 may be "healed" by use of the mobile lubricant 131 that has been formed from the lubricant part of the lubricant molecules (not shown), or portion thereof, in a lubricant layer 401 disposed on a surface 501 of the device package 502. FIG. 6A illustrates a cross-sectional view of the single mirror assembly 101 that has a continuous lubricant coating 301 deposited over the exposed surfaces and a mobile lubricant 131 disposed around it within a processing region 513. FIG. 6B illustrates how the lubricant coating 301 becomes damaged due to the interaction of elements 102 and 104A during operation. In particular, the lubricant coating 301 may become displaced or damaged due to the contact between the interacting surfaces, which can leave exposed regions of the underlying surfaces, as represented by area "G" in FIG. 6C. A cross-sectional view of the single mirror assembly 101 in its undeflected state is also shown in FIG. 6C where the damaged sections of the lubricant coating 301 are "healed" due to the adsorption of the mobile lubricant 131 (e.g., lubricant part of the lubricant molecules 404) in the exposed regions "G." FIG. 6D illustrates how the mobile lubricant 131 reduces the interaction between elements 102 and 104A by the adsorption or buffering effect of the lubricant in the exposed regions "G". Again, the adsorption or buffering effect increases the longevity of the single mirror assembly 101 by extending the useful life of the lubricant coating 301 disposed over the interacting regions of the single mirror assembly 101.

Referring to FIG. 6A, in another embodiment, a resistive heating element 611 is incorporated within or on a surface of an unused area 615 of the device package 502 to help enable the preferential release of the lubricant molecules contained within lubricant coating 301 above or adjacent to the heating element 611. By use of a controller 613 coupled to a power supply 612 that is in communication with the embedded heating elements 611 the lubricant molecules that are above or adjacent to the heating elements 611 can be preferentially desorbed into the processing region 513.

Lubricant Delivery and Bonding Processes

In an effort to deliver the mobile lubricant molecules to the various contacting and non-contacting surfaces within a MEMS device package 230 one or more lubricant deposition techniques may be performed during the MEMS packaging process or after the MEMS packaging process. It is generally desirable to deliver the lubricant to the processing region (e.g., Item # 234 in FIG. 2A), after the device package has been formed to prevent the degradation of the lubricant molecules, due to the high temperatures the MEMS components typically see during the MEMS device packaging process.

Figure 7A:
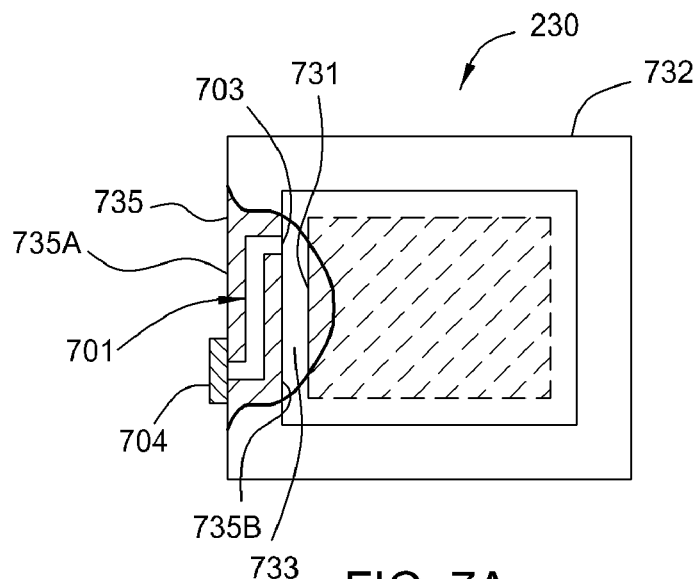
FIG. 7A illustrates a cross-sectional plan view of a device package assembly, according to one embodiment of the invention.
Figure 7B:
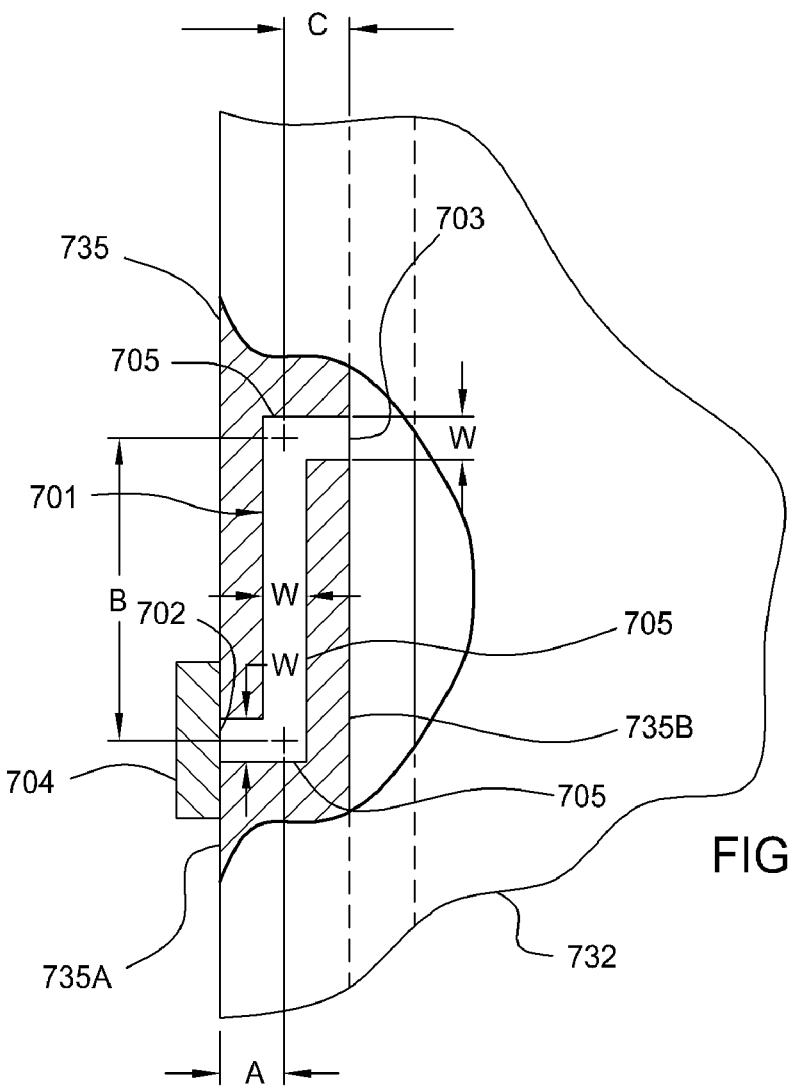
FIG. 7B illustrates a close-up of a partial section view illustrated in FIG. 7A, according to one embodiment of the invention.

FIG. 7A illustrates a plan view of a MEMS device package 230 that contains a lubricant channel 701 that is used to deliver the mobile lubricant to the processing region 733 of the MEMS device package 230 after the device package has been formed. The MEMS device package 230 contains a MEMS device 731 that is positioned within the processing region 733. FIG. 7A is a partial section view that highlights a lubricant channel 701 that is formed in the MEMS device package 230 illustrated in FIGS. 2A and 5A. FIG. 7B illustrates a close-up view of the lubricant channel 701 shown in FIG. 7A. The lubricant channel 701 may be formed in any one of the walls that encloses the processing region 733. The lubricant channel 701 may be formed using conventional patterning, lithography and material removal techniques (e.g., wet etch, dry etch, laser ablation). In one embodiment, as shown in FIGS. 7A and 7B, the lubricant channel 701 is formed in a wall 735. The lubricant channel 701 generally extends from an exterior surface 735A to an interior surface 735B of one of the walls that encloses the processing region 733. To prevent contamination or particles from making their way into the processing region 733 from the outside environment through the lubricant channel 701, a cap 704 is typically positioned over the channel inlet 702. The cap 704 may be a polymer, such as an epoxy or silicone, or other solid material that is bonded to the exterior surface 735A using conventional sealing techniques. An example of an apparatus and method of forming a MEMS device package that contains a lubricant channel that can be used to deliver the mobile lubricant to the processing region is further described in the commonly assigned U.S. patent application Ser. No. 11/538,033 [MIRA 0008], filed Oct. 2, 2006, which is incorporated by reference in its entirety.

Figure 7C:
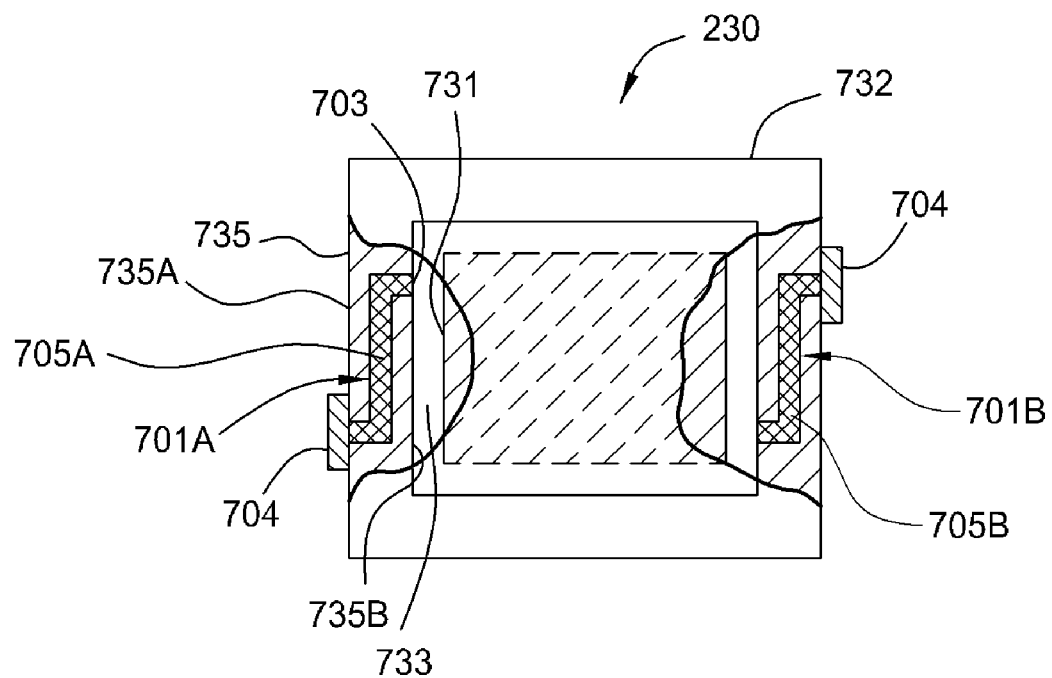
FIG. 7C illustrates a cross-sectional plan view of a device package assembly, according to one embodiment of the invention.

The lubricant channel 701 is adapted to contain a desired amount of a lubricant material (not shown) that vaporizes or diffuses into the processing region 733 over time. The rate with which the lubricant material migrates into the processing region is set by the geometry of the lubricant channel 701, the type of lubricating material (e.g., lubricant's molecular weight), the lubricant material's bond strength to surfaces with the processing region (e.g., physisorption, chemiosorption), the capillary force created by the surface tension of the lubricant against the surfaces within the channel, the temperature of the lubricant, and pressure of volume contained within the processing region 733. Referring to FIG. 7B, the volume of the lubricant channel 701 is defined by the formed length times the cross-sectional area of the lubricant channel 701. The length of the lubricant channel 701 is the length of channel that extends from the exterior surface 735A to the interior surface 735B, such the sum of the length of segments A, B and C, as shown in FIG. 7B. In one aspect, the cross-sectional area (not shown) is defined by the depth (not shown) and width W of the lubricant channel 701 formed in one of the walls that encloses the processing region 733. In one embodiment, the width W of the lubricant channel 701 is between about 10 micrometers ($\mu m$) and about 800 $\mu m$ and the depth is between about 10 micrometers ($\mu m$) and about 200 $\mu m$. In one embodiment, a lubricant channel 701 is adapted to contain a volume of lubricant between about 0.1 nanoliters (nl) and about 1000 nl. The cross-section of the lubricant channel 701 need not be square or rectangular, and can be any desirable shape without varying from the basic scope of the invention. Generally, a sufficient amount of replenishing lubricant molecules are stored inside the lubricant channels 701 so that the enough lubricant molecules are available to prevent stiction type failures at the interacting areas of the MEMS device during the entire life cycle of the product In general, a MEMS device package may have one or more lubricant channels 701 formed in one or more regions of the formed device. Each of the formed channels may contain a different mobile lubricant that can be used to prolong the life of the formed MEMS device. FIG. 7C illustrates a MEMS device package 230 that contains two lubricant channels 701A, 701B that each have a volume of a mobile lubricant (i.e., item #s 705A and 705B) disposed therein to provide a ready supply of one or more lubricant to the processing region 733. During the normal operation of the MEMS device 731, molecules of the lubricant material tend to migrate to all areas within the processing region 733. The continual migration of the mobile lubricants 705A, 705B is useful to prevent stiction-related failures at a contact region between two interacting MEMS components. As the lubricant molecules breakdown at the contact regions and/or adsorb onto other surfaces within the processing region 733 during operation of the device, "fresh" lubricant molecules replace the broken-down or adsorbed lubricant molecule(s), thereby allowing the deposited lubricant in the lubricant channel 701 to act as a lubricant reservoir.

In one embodiment, it is desirable to connect a pump (not shown) up to the injection port 702 (FIG. 7A) so that it can be used to evacuate the processing region 733 to remove one or more of the mobile lubricants and/or dilutant contained therein. In this case the pump may be used to evacuate the processing region to a sufficient pressure to cause the lubricant to vaporize and thus be swept from the device package.

In another embodiment, it may be desirable to connect a gas source (not shown) to one injection port (e.g., item # 701A in FIG. 7C) and then remove a cap (e.g., item # 704 FIG. 7C) from a second injection port (e.g., item # 701B in FIG. 7C) so that gas delivered from the gas source to the processing region can be used to sweep out any used or degraded lubricant material. In either case, these types of techniques can be used to remove old and/or degraded lubricant material so that new lubricant material can be added to the processing region, using the methods described above, to extend the life of the MEMS device.

Figure 7D:
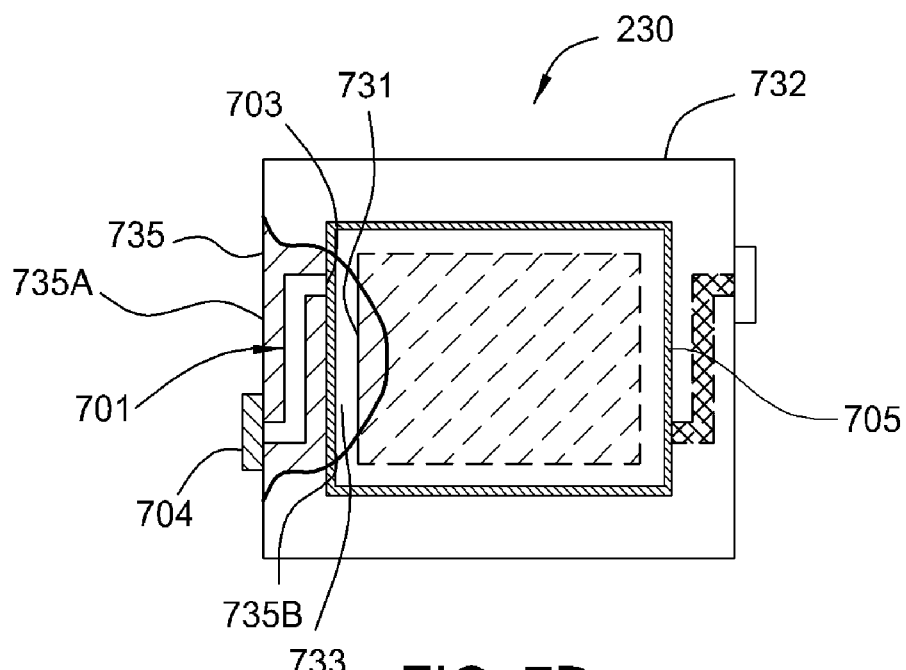
FIG. 7D illustrates a cross-sectional plan view of a device package assembly, according to one embodiment of the invention.

In one embodiment, illustrated in FIG. 7D, the size of the lubricant channel is selected so that the surface tension of a liquid lubricant against the surfaces of the lubricant channel 701 causes the lubricant material to be drawn from a position outside of the MEMS device package 230 into lubricant channel 701 and then into the processing region 733. In this way the lubricant channel acts as a liquid injection system that allows the user to deliver an amount of the lubricant material 705 into the processing region 733, by use of the capillary force(s) created when the lubricant contacts the walls of the lubricant channel. In one example, the width W of the lubricant channel 701 is between about 100 micrometers ($\mu m$) and about 600 $\mu m$ and the depth is between about 100 micrometers ($\mu m$)±50 $\mu m$. When in use, the capillary force(s) can be used to deliver an amount of lubricant material that is smaller or larger than volume of the channel 701. In this configuration it may be possible to deliver different volumes of two or more different lubricants through the same lubricant channel 701, or to transmit one type of lubricant through the channel first and retain another type of lubricant in the same lubricant channel in a subsequent step. In one embodiment, to assure that a precise quantity of the lubricant material is delivered to into the processing region 733 the lubricant material is diluted within a solvent to form a mixture that is then injected into the processing region through the lubricant channel 701. In some cases it may be desirable to remove the excess solvent material after the lubricant material has formed a bond with a desired surface in the processing region of the MEMS device by evacuating the processing region to a pressure that will preferentially remove the solvent and leave the lubricant material.

Referring to FIGS. 7C-7D, in one embodiment, the first lubricant channel 701A contains a first mobile lubricant 705A and the second lubricant channel 701A contains a second mobile lubricant 705A. In this case the first mobile lubricant 705A and the second mobile lubricant 705B may each have a different head group (e.g., item # 415 in FIG. 5C) and/or organic molecule (e.g., item # 416 in FIG. 5C) so that the vapor pressure, mobility, and/or affinity to bond to different surfaces within the processing region 733 can be tailored to improve the usable life of the formed MEMS device. In one aspect, the first mobile lubricant 705A contains a head group that preferentially bonds to metal surfaces, such as the landing pads 104A-104B (FIG. 2B), while the second mobile lubricant 705B contains a head group that is adapted to preferentially bond to the other areas of the MEMS device. In one aspect, the second mobile lubricant 705B is adapted to bond to the storage surfaces of the MEMS device, which may include semiconducting and dielectric materials, such as silicon, silicon dioxide or a glass material.

In another embodiment, the mobile lubricants 705A, 705B is selected so that a portion of the lubricant vaporizes to form a vapor, or gas, within the processing region during normal operation of the device. In cases where the MEMS device is a spatial light modulator (SLM), typical device operating temperatures, and/or ambient temperatures, may be in a range between about 0° C. and about 70° C. It should be noted that the ability of the lubricant to form a vapor or gas is dependent on the lubricant's equilibrium partial pressure which varies as a function of the temperature of the lubricant, the pressure of the region surrounding the lubricant, the lubricant material's bond strength to surfaces with the processing region (e.g., physisorption, chemiosorption), and its molecular weight. In another embodiment, the lubricant is selected due to its ability to rapidly diffuse along the surfaces within the processing region 733.

Spatial Light Modulator Examples

Figure 8A:
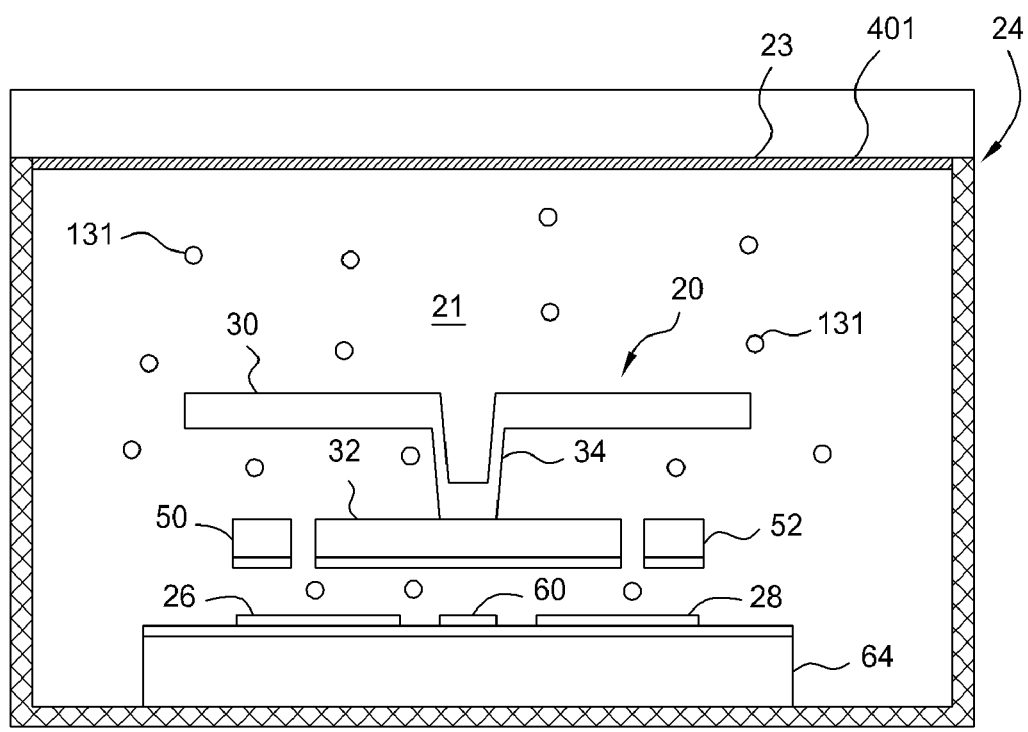
FIG. 8A schematically illustrates a cross-sectional view of an improved pixel device according to this invention.
Figure 8B:
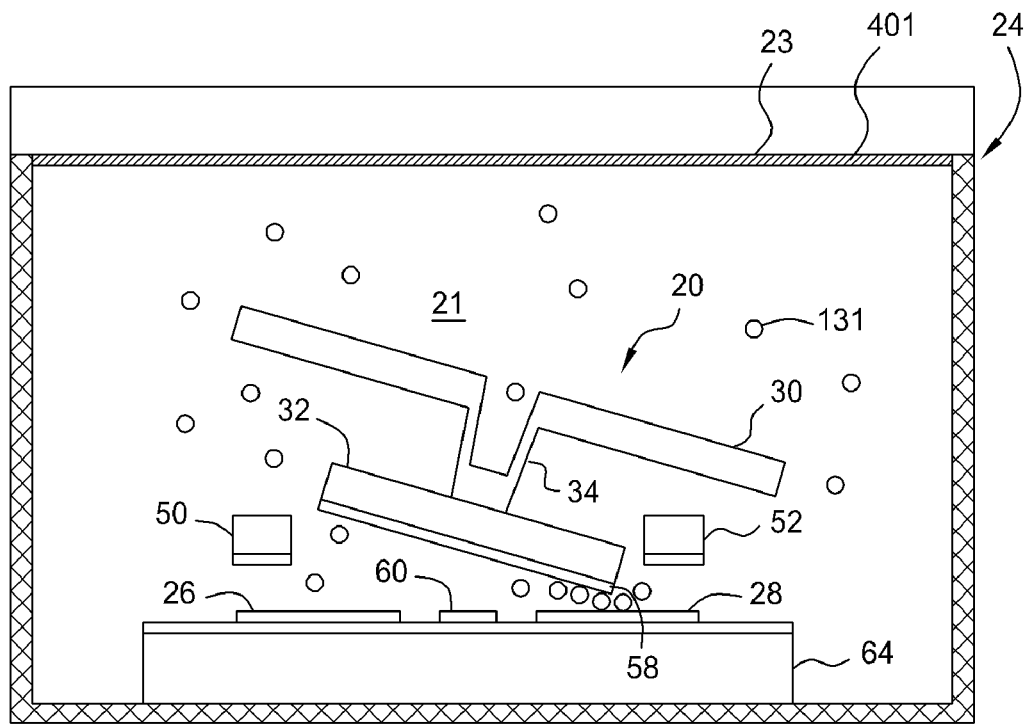
FIG. 8B schematically illustrates a cross-sectional view of an improved pixel device in a deflected state, according to one embodiment of the invention.

An example of another type of devices that may benefit from the various embodiments of the invention described herein is shown in FIGS. 8A-8B. FIG. 8A illustrates a cross-sectional view of a single "pixel" 20 found in a digital micro-mirror device (DMD) spatial light modulator in its undeflected state. As shown in FIG. 8A, a mobile lubricant 131, which is formed from the lubricant parts in a lubricant layer 401, is disposed within a region 21 of a package 24. Adding and using the lubricant layer 401 in this fashion reduces stiction problems. The pixel 20 may generally contain a mirror 30, support posts 34, a yoke 32, mirror address electrodes 50 and 52, and address electrodes 26 and 28. FIG. 8B illustrates a cross-sectional view of the pixel 20 in its deflected state after a sufficient bias has been applied between the address electrode 28 and the yoke 32 and between the elevated electrode 52 and the mirror 30. In this configuration, the mobile lubricant 131 disposed around a pixel 20 reduces the chances of stiction forces arising between the yoke tip 58 and the address electrode 28 by reducing the interaction of these surfaces, in the fashion discussed above. A specific example of a device that may benefit from the teaching of the invention set forth herein is further described in U.S. Pat. No. 5,771,116, filed Oct. 21, 1996.

Figure 8C:
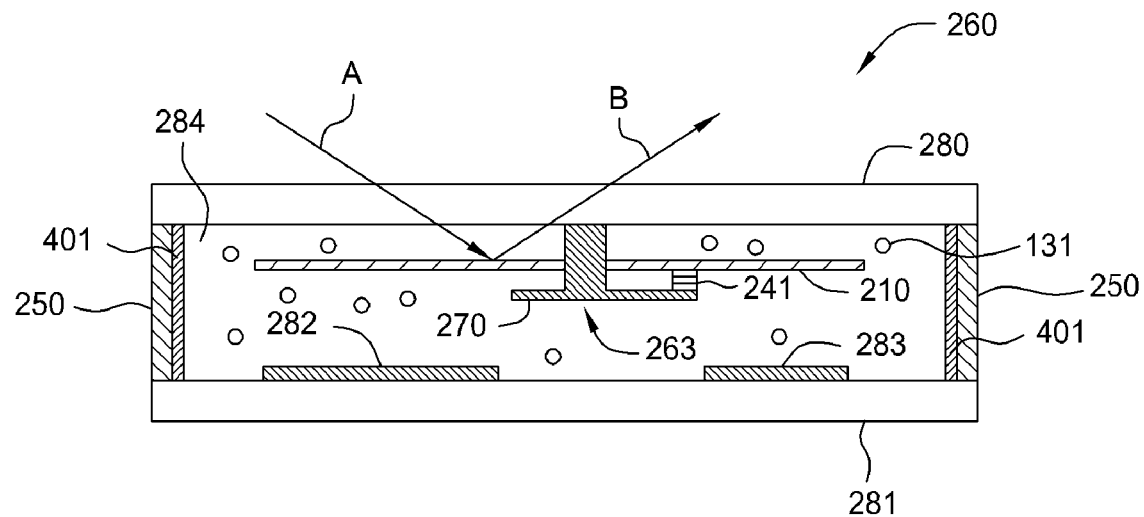
FIG. 8C schematically illustrates a cross-sectional view of an improved MEMS moveable mirror device according to this invention.
Figure 8D:
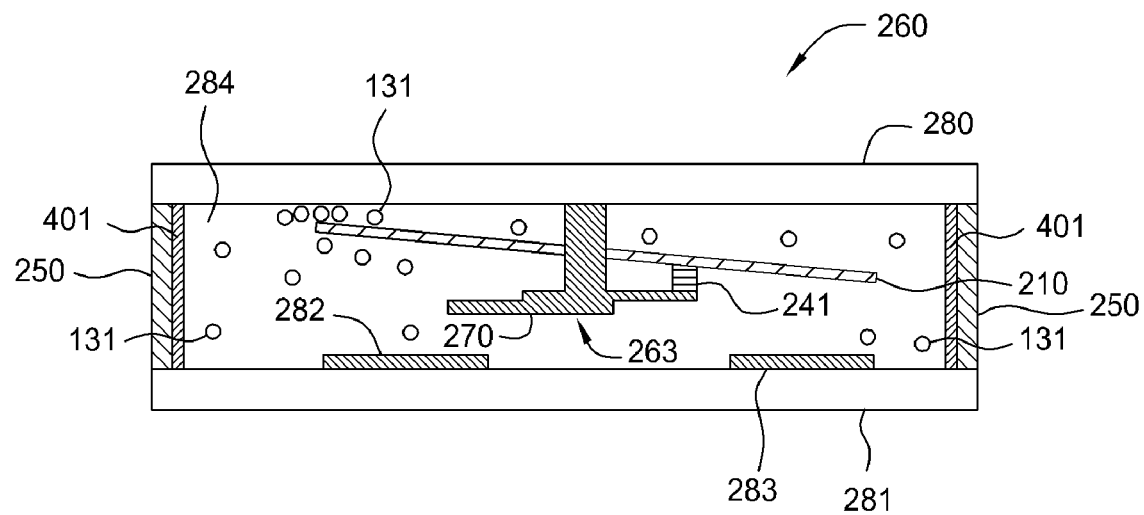
FIG. 8D schematically illustrates a cross-sectional view of an improved MEMS moveable mirror device in a deflected state, according to one embodiment of the invention.

Another example of a MEMS device that may benefit from the various embodiments of the invention described herein is shown in FIGS. 8C-8D. The moveable mirror device 260 may generally contain a micro-mirror plate 210, electrodes 282 and 283, a hinge support 263, a shallow via contact 241 for providing a rotational axis, a wafer 281, and mirror stops 270. FIG. 8C illustrates a cross-sectional view of a micro-mirror plate 210 that is in its undeflected state that has a mobile lubricant 131 disposed in the region 284 that surrounds the micro-mirror plate 210. Again, adding the mobile lubricant 131 reduces stiction-related problems created when the micro-mirror plate 210 interacts with other surfaces of the moveable mirror device 260. FIG. 8D illustrates a cross-sectional view of the micro-mirror plate 210 in its deflected state after a sufficient bias has been applied between the electrode 283 and the micro-mirror plate 210 by a power supply (not shown). In this configuration the mobile lubricant 131 disposed around the micro-mirror plate 210 reduces the chances that substantial stiction forces will arise between the micro-mirror plate 210 and the glass substrate 280 by reducing the interaction of the surfaces, as discussed above. A specific example of a device that may benefit from the teaching of the invention set forth herein is further described in U.S. Pat. No. 6,960,305, filed Mar. 28, 2003.

Device Packaging Examples

Figure 9A:
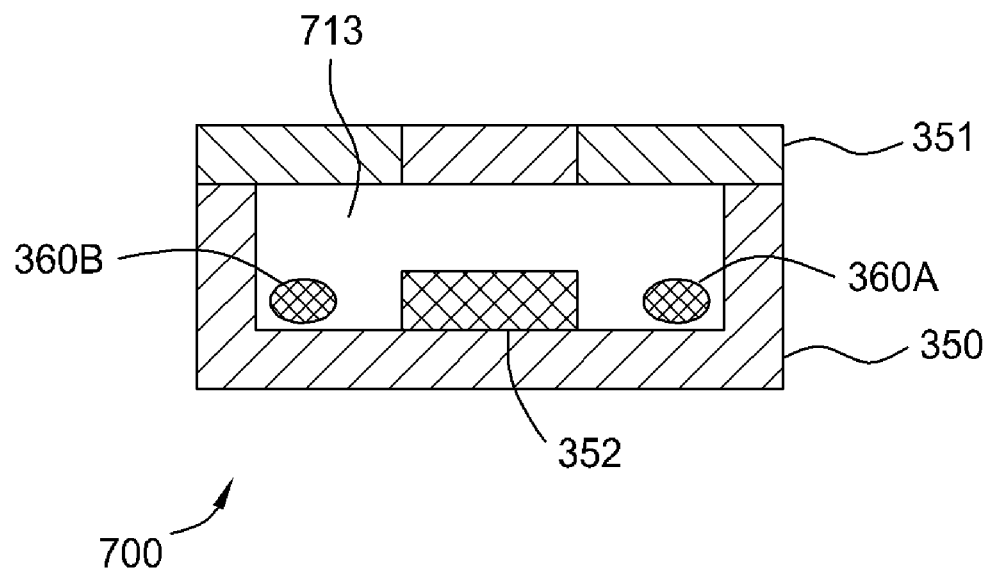
FIG. 9A illustrates a cross-sectional view of a device package assembly, according to one embodiment of the invention.
Figure 9B:
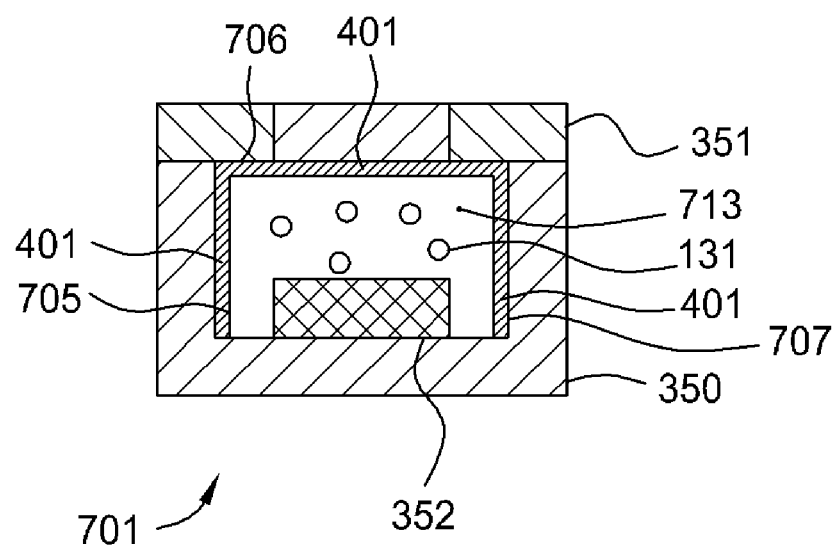
FIG. 9B illustrates a cross-sectional view of a device package assembly, according to one embodiment of the invention.

FIG. 9A is cross-sectional view of device package 700 that has two getters 360 positioned in the processing region 713. As noted above, adding reversibly absorbing getters to device packages to retain the lubricating materials substantially increases the device package size and the complexity of forming the device and also adds steps to the fabrication process. Such device package designs have an increased piece-part cost and an increased overall manufacturing cost, due to the addition of extra getter components. Therefore, by depositing a lubricant layer 401 on various unused surfaces within a formed device a large volume of lubricant can be reliably and inexpensively delivered to the processing region 713 and other desired areas of the device, as shown in FIG. 9B. The use of the lubricant layer 401 can thus eliminate the need for the getters 360.

By contrast, FIG. 9B illustrates a cross-sectional view of a device package 701 that contains a mobile lubricant 131 that has been formed from lubricant parts in a lubricant layer 401. Since the space in the processing region 234 that was taken up by the getters 360 is not needed the device package can be made much smaller in size than conventional device packages, such as device package 700 of FIG. 9A. Among other things, the reduction in the device package size advantageously reduces the manufacturing and piece-part costs.

In sum, the systems and techniques disclosed herein preferentially deposits a lubricant layer on desired regions of the device to form a ready supply of lubricant that is used to reduce stiction-related forces, and/or provide anti-wear protection between contacting surfaces of micromechanical devices, such as MEMS devices, NEMS devices. Among other things, gas or vapor phase lubricant parts formed from the preferentially deposited layer(s) diffuse at rates that are orders of magnitude higher than the diffusion rates of conventional solid or liquid lubricants diffuse. A higher diffusion rate enables a lubricant to be self-replenishing, meaning that lubricants can quickly move back into a contact region after being physically displaced from the region by the contacting surfaces of the micromechanical device during operation. Consequently, lubricants are more reliable than conventional solid or liquid lubricants in preventing stiction-related device failures. Further, lubricants and ways to replenish these lubricants may be included in device package designs without introducing costly fabrication steps or substantially increasing overall design complexity. Thus, lubricants provide a reliable, cost-effective way to reduce stiction-related forces in MEMS or NEMS devices relative to conventional solid or liquid lubricants.

While the foregoing is directed to embodiments of the present invention, other and further embodiments of the invention may be devised without departing from the basic scope thereof, and the scope thereof is determined by the claims that follow.

The invention claimed is:

1. A method of operating a micromechanical device, comprising biasing one or more electrodes that are disposed within a processing region, wherein biasing the one or more electrodes causes a moveable component having a first contact surface to interact with a second contact surface, and wherein one or more normal operating conditions cause a lubricant molecule, which has a head group that is adapted to bond to a first surface disposed in the processing region, to migrate from the first surface to a space formed between the first and second contact surfaces during normal operation.

2. The method of claim 1, wherein the one or more normal operating conditions are selected from a group consisting of biasing the one or more electrodes, and providing an ambient temperature between about 0° C. and about 70° C.

3. The method of claim 1, wherein the moveable component comprises a mirror.

4. The method of claim 1, wherein the micromechanical device is an optical image processor or a spatial light modulator.

5. The method of claim 1, wherein the lubricant molecules comprise a fluorinated compound that have a molecular weight greater than about 100 amu.

6. The method of claim 1, wherein the lubricant molecules have the head group that is selected from a group consisting of an oxysilane functional group, a trichlorosilane functional group and a carboxilate functional group.

7. The method of claim 1, wherein the temperature in the processing region during normal operation is between about 0° C. and about 70° C.

8. A method of operating a micromechanical device comprising:
  biasing one or more electrodes that are disposed within a processing region, wherein biasing the one or more electrodes causes a moveable component having a first contact surface to interact with a second contact surface; and
  delivering an amount of energy to a process surface that is contained within the processing region from an energy source that is in thermal communication with the process surface, wherein a plurality of lubricant molecules disposed on the process surface are adapted to detach from the process surface when exposed to the amount of energy and migrate to a position between the first contact surface and the second contact surface.

9. The method of claim 8, wherein the moveable component comprises a mirror.

10. The method of claim 8, wherein the micromechanical device is an optical image processor or a spatial light modulator.

11. The method of claim 8, wherein the plurality of lubricant molecules that are a fluorinated compound that have a molecular weight greater than about 100 amu.

12. The method of claim 8, wherein the energy source is adapted to deliver optical radiation or thermal energy to the lubricant molecules on the process surface.

13. The method of claim 8, further comprising forming the plurality of lubricant molecules which comprise a head group that is adapted to bond to the process surface.

14. The method of claim 13, wherein the head group is selected from a group consisting of an oxysilane functional group, a trichlorosilane functional group and a carboxilate functional group.

15. A method of operating a micromechanical device comprising:
  positioning a micromechanical device in a first position, wherein the micromechanical device comprises:
    a first contact surface that is disposed in a processing region;
    an electrode coupled to a base;
    a mirror coupled to the base and having a conductive region, a reflective mirror surface and a second contact surface, wherein the second contact surface interacts with the first contact surface during device operation;
    a power supply that is in electrical communication with the conductive region and the electrode; and
    a plurality of lubricant molecules that each have a head group that is adapted to bond to a process surface, wherein the process surface is a portion of one or more walls that enclose the processing region;
  positioning a light source so that a portion of the optical radiation emitted by the light source is reflected by the mirror surface; and
  biasing the electrode relative to the conductive region to a potential that causes the mirror to move to a desired position and that causes the first contact surface to interact with the second contact surface,
  wherein during normal operation of the micromechanical device the plurality of lubricant molecules migrate from the process surface to a space formed between the first and second contact surfaces.

16. The method of claim 15, wherein the plurality of lubricant molecules are a fluorinated compound that has a molecular weight greater than about 100 amu.

17. The method of claim 15, wherein the micromechanical device is an optical image processor or a spatial light modulator.

18. The method of claim 15, wherein the head group is selected from a group consisting of an oxysilane functional group, a trichlorosilane functional group and a carboxilate functional group.

* * * * *